US010395369B2

(12) United States Patent
Mulkern et al.

(10) Patent No.: US 10,395,369 B2
(45) Date of Patent: Aug. 27, 2019

(54) METHODS AND APPARATUS FOR BONE SEGMENTATION IN MAGNETIC RESONANCE IMAGES

(71) Applicant: Children's Medical Center Corporation, Boston, MA (US)

(72) Inventors: Robert V. Mulkern, Boston, MA (US); Delma Jarrett, Jamaica Plain, MA (US); Mukund Balasubramanian, Cambridge, MA (US)

(73) Assignee: Children's Medical Center Corporation, Boston, MA (US)

( * ) Notice: Subject to any disclaimer, the term of this patent is extended or adjusted under 35 U.S.C. 154(b) by 71 days.

(21) Appl. No.: 15/577,854

(22) PCT Filed: May 26, 2016

(86) PCT No.: PCT/US2016/034279
§ 371 (c)(1),
(2) Date: Nov. 29, 2017

(87) PCT Pub. No.: WO2016/196176
PCT Pub. Date: Dec. 8, 2016

(65) Prior Publication Data
US 2018/0150953 A1   May 31, 2018

Related U.S. Application Data

(60) Provisional application No. 62/168,564, filed on May 29, 2015.

(51) Int. Cl.
*G06K 9/00*   (2006.01)
*G06T 7/00*   (2017.01)
(Continued)

(52) U.S. Cl.
CPC ............ *G06T 7/0014* (2013.01); *B33Y 50/00* (2014.12); *G01R 33/4828* (2013.01);
(Continued)

(58) Field of Classification Search
CPC ................ G01R 33/4828; G01R 33/50; G01R 33/5608; G01R 33/5618; G01R 33/56527;
(Continued)

(56) References Cited

U.S. PATENT DOCUMENTS

2013/0039558 A1*   2/2013   Balter ................. G06K 9/6289
382/131

OTHER PUBLICATIONS

International Search Report and Written Opinion for International Application No. PCT/US2016/034279 dated Aug. 31, 2016.
(Continued)

*Primary Examiner* — Avinash Yentrapati
(74) *Attorney, Agent, or Firm* — Wolf, Greenfield & Sacks, P.C.

(57) ABSTRACT

Methods and apparatus for processing magnetic resonance imaging (MRI) data to perform bone segmentation. MRI data comprising a set of gradient-echo images acquired throughout a spin echo is processed to generate a bone segmentation image. The bone segmentation image is generated based, at least in part, on at least two images in the set of gradient-echo images, wherein the at least two images include a first image corresponding to a beginning portion of the spin echo and a second image corresponding to a central portion of the spin echo.

20 Claims, 21 Drawing Sheets

(51) Int. Cl.
| | |
|---|---|
| G01R 33/48 | (2006.01) |
| G01R 33/56 | (2006.01) |
| G06T 7/11 | (2017.01) |
| G06T 7/194 | (2017.01) |
| B33Y 50/00 | (2015.01) |
| G06T 7/136 | (2017.01) |
| G06T 5/50 | (2006.01) |
| G01R 33/50 | (2006.01) |
| G01R 33/561 | (2006.01) |
| G01R 33/565 | (2006.01) |

(52) U.S. Cl.
CPC ............ *G01R 33/5608* (2013.01); *G06T 5/50* (2013.01); *G06T 7/11* (2017.01); *G06T 7/136* (2017.01); *G06T 7/194* (2017.01); *G01R 33/50* (2013.01); *G01R 33/5618* (2013.01); *G01R 33/56527* (2013.01); *G06T 2200/08* (2013.01); *G06T 2207/10088* (2013.01); *G06T 2207/20224* (2013.01); *G06T 2207/30008* (2013.01)

(58) Field of Classification Search
CPC ....... G06T 2200/08; G06T 2207/10088; G06T 2207/20224; G06T 2207/30008; G06T 5/50; G06T 7/0014; G06T 7/11; G06T 7/136; G06T 7/194
See application file for complete search history.

(56) References Cited

OTHER PUBLICATIONS

International Preliminary Report on Patentability for Application No. PCT/US2016/034279 dated Dec. 14, 2017.

Balasubramanian et al., Bone marrow segmentation based on combined consideration of transverse relaxation processes and Dixon oscillations. NMR in Biomedicine. Feb. 11, 2016;29(5):553-62.

Balasubramanian et al., Leveraging transverse relaxation processes and Dixon oscillations to achieve high-quality segmentation of bone marrow. Proceedings of the International Society for Magnetic Resonance in Medicine, 23$^{rd}$ Annual Meeting and Exhibition. May 15, 2015;125:0125.

Doi, Visualization and Image Analysis: (3) Image reconstruction and rapid prototyping by 3D printer. Japanese Society of Medical Imaging Technolog. Nov. 2012;30(5):303-8.

Hopkins et al., Three-Dimensional GESFIDE for Measuring $R_2$ and $R_2^1$. Proceedings of the International Society for Magnetic Resonance in Medicine. Apr. 18, 1998.

Johnson et al., 2D Multislice and 3D MRI Sequences Are Often Equally Sensitive. Magnetic Resonance in Medicine. Apr. 1, 1999;41(4):824-8.

Majumdar et al., Evaluation of Technical Factors Affecting the Quantification of Trabecular Bone Structure Using Magnetic Resonance Imaging. Bone. Oct. 1, 1995;17(4):417-30.

Mulkern et al., On the Lorentzian versus Gaussian Character of Time-Domain Spin-Echo Signals from the Brain as Sampled by Means of Gradient-Echoes: Implication for Quantitative Transverse Relaxation Studies. Magnetic Resonance in Medicine. Jul. 30, 2014;74(1):51-62.

Yablonskiy et al., An MRI Method for Measuring $T_2$ in the Presence of Static and RF Magnetic Field Inhomogeneities. Magnetic Resonance in Medicine. Jun. 1997;37(6):872-6.

PCT/US2016/034279, dated Aug. 31, 2016, International Search Report and Written Opinion.

PCT/US2016/034279, dated Dec. 14, 2017, International Preliminary Report on Patentablity.

* cited by examiner

METHODS AND APPARATUS FOR BONE SEGMENTATION IN MAGNETIC RESONANCE IMAGES

CROSS REFERENCE TO RELATED APPLICATIONS

This application is a National Stage filing under 35 U.S.C. § 371 of International Application PCT/US2016/034279, filed May 26, 2016, which claims the benefit under 35 U.S.C. § 119(e) to U.S. Provisional Application Ser. No. 62/168,564, entitled "METHODS AND APPARATUS FOR BONE SEGMENTATION IN MAGNETIC RESONANCE IMAGES," filed on May 29, 2015, the entire contents of each of which is incorporated herein by reference.

BACKGROUND

Medical images of bone structures in the human body are useful in a wide variety of applications, such as evaluating injuries and for pre-surgical planning. Computed tomography is the most prevalent technique for imaging bone by detecting interactions between ionizing radiation (e.g., x-rays) passed through the body and tissue structures within the body. Recently, other imaging techniques, such as magnetic resonance imaging (MRI), that do not use ionizing radiation, have also been used to image and segment bone with varying degrees of success relative to CT-based techniques.

SUMMARY

Some embodiments are directed to a computer system configured to process magnetic resonance imaging (MRI) data to perform bone segmentation. The computer system comprises an input interface configured to receive the MRI data, wherein the MRI data comprises a set of gradient-echo images acquired throughout a spin echo, at least one processor programmed to generate based, at least in part, on at least two images in the set of gradient-echo images, a bone segmentation image, wherein the at least two images include a first image corresponding to a beginning portion of the spin echo and a second image corresponding to a central portion of the spin echo, and an output interface configured to output the bone segmentation image.

Other embodiments are directed to a method of performing bone segmentation by processing magnetic resonance imaging (MRI) data. The method comprises receiving the MRI data, wherein the MRI data comprises a set of gradient-echo images acquired by an MRI system throughout a spin echo, generating, by at least one computer, a bone segmentation image, wherein the generating is based, at least in part, on at least two images in the set of gradient-echo images, wherein the at least two images include a first image corresponding to a beginning portion of the spin echo and a second image corresponding to a central portion of the spin echo, and outputting the bone segmentation image.

Other embodiments are directed to a non-transitory computer readable medium encoded with a plurality of instructions that, when executed by at least one computer, perform a method of performing bone segmentation by processing magnetic resonance imaging (MRI) data. The method comprises receiving the MRI data, wherein the MRI data comprises a set of gradient-echo images acquired by an MRI system throughout a spin echo, generating based, at least in part, on at least two images in the set of gradient-echo images, a bone segmentation image, wherein the at least two images include a first image corresponding to a beginning portion of the spin echo and a second image corresponding to a central portion of the spin echo, and outputting the bone segmentation image.

Other embodiments are directed to a magnetic resonance imaging (MRI) system, comprising: a superconducting magnet configured to produce a main magnetic field for the MRI system; a plurality of gradient coils configured to produce magnetic field gradients in the main magnetic field; a plurality of radiofrequency (RF) coils configured to produce oscillating magnetic fields to transmit and receive signals from an object to be imaged; and at least one processor. The at least one processor is programmed to control the plurality of gradient coils and RF coils in a sequence to acquire MRI data comprising a set of gradient-echo images acquired throughout a spin echo and generate based, at least in part, on at least two images in the set of gradient-echo images, a bone segmentation image, wherein the at least two images include a first image corresponding to a beginning portion of the spin echo and a second image corresponding to a central portion of the spin echo.

Other embodiments are directed to a method of acquiring MRI data for bone segmentation using an MRI system that includes a plurality of gradient coils and RF coils. The method comprises controlling the plurality of gradient coils and RF coils in a sequence to transmit an excitation pulse followed by a refocusing pulse, and to acquire two gradient-echo images, wherein a first gradient-echo image of the two gradient-echo images is acquired at a beginning portion of a spin echo and a second gradient-echo image of the two gradient-echo images is acquired at a central portion of the spin echo and generating a bone segmentation image based, at least in part, on the first gradient-echo image and the second gradient-echo image.

Other embodiments are directed to a magnetic resonance imaging (MRI) system, comprising: a superconducting magnet configured to produce a main magnetic field for the MRI system; a plurality of gradient coils configured to produce magnetic field gradients in the main magnetic field; a plurality of radiofrequency (RF) coils configured to produce oscillating magnetic fields to transmit and receive signals from an object to be imaged; and at least one processor. The at least one processor is programmed to control the plurality of gradient coils and RF coils in a sequence to transmit an excitation pulse followed by a refocusing pulse, and to acquire two gradient-echo images, wherein a first gradient-echo image of the two gradient-echo images is acquired at a beginning portion of a spin echo and a second gradient-echo image of the two gradient-echo images is acquired at a central portion of the spin echo and generate a bone segmentation image based, at least in part, on the first gradient-echo image and the second gradient-echo image.

Other embodiments are directed to a method of acquiring MRI data for bone segmentation using an MRI system that includes a plurality of gradient coils and RF coils. The method comprises controlling the plurality of gradient coils to encode frequency in an x-direction and to encode phase in a y-direction and a z-direction, controlling the RF coils in a sequence to transmit an excitation pulse followed by a refocusing pulse, and to acquire three-dimensional MRI data comprising set of gradient-echo images acquired during a spin echo, and generating based, at least in part, on at least two images in the set of gradient-echo images, a bone segmentation image, wherein the at least two images include a first image corresponding to a beginning portion of the spin echo and a second image corresponding to a central portion of the spin echo.

It should be appreciated that all combinations of the foregoing concepts and additional concepts discussed in greater detail below (provided that such concepts are not mutually inconsistent) are contemplated as being part of the inventive subject matter disclosed herein.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
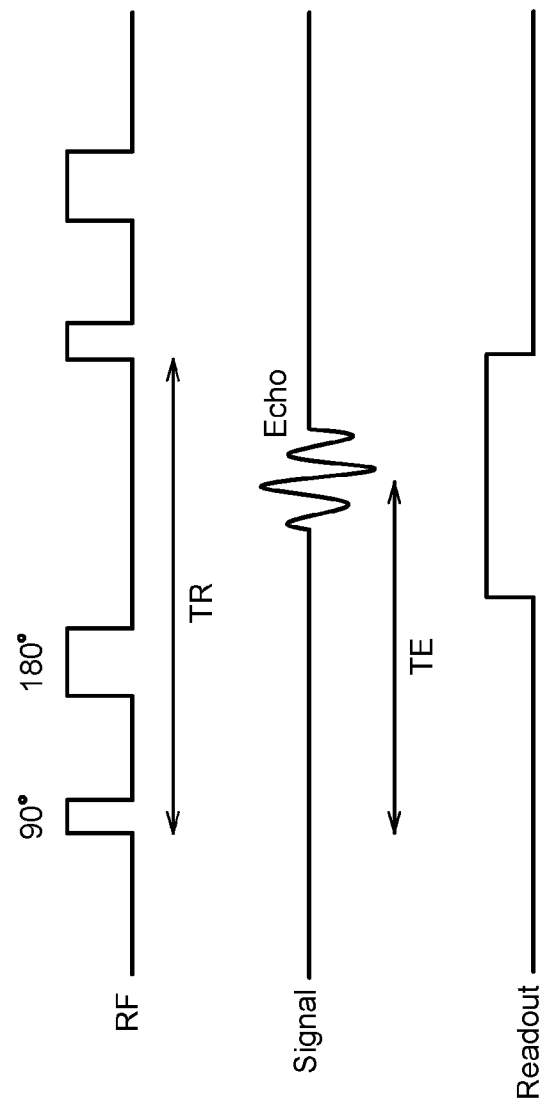
FIG. 1 illustrates a schematic diagram of a spin echo sequence that may be used in accordance with some embodiments.

Following below are more detailed descriptions of various concepts related to, and inventive embodiments of, methods and apparatus according to the present disclosure for generating a bone segmentation image from MRI data. It should be appreciated that various aspects of the subject matter introduced above and discussed in greater detail below may be implemented in any of numerous ways, as the subject matter is not limited to any particular manner of implementation. Examples of specific implementations and applications are provided primarily for illustrative purposes.

Selective imaging of bone has a number of potential applications. For example, there has been an increasing awareness of the morphologic changes of the hips that can lead to problems with pain, mobility, and cartilage loss. Broadly, these hip disorders can be divided into hip dysplasia and femoroacetabular impingement. The goal is to recognize and treat these disorders early, in the pediatric and young adult population, to avoid progression to premature osteoarthritis, with hip dysplasia thought to be responsible for 20-40% of adult osteoarthritis. Surgical treatment options include recontouring and/or redirecting the femoral head (with osteochondroplasty or intertrochanteric osteotomy) or acetabulum (with periacetabular osteotomies or rim trim), depending on the specific morphologic abnormality of the hip to be corrected. To this end, orthopedic surgeons require detailed imaging of the hips to determine their surgical approach.

As discussed above, the use of CT is widely accepted and predominantly used for generating three-dimensional reconstructions of bone structures due to the ability to easily segment bone from soft tissues in CT images. However, the use of ionizing radiation in CT is undesirable, as exposure to ionizing radiation may lead to a higher probability of cancers later in life. This is a particularly important consideration for pediatric applications and motivates the search for approaches that allow assessment of bone morphology without the use of ionizing radiation and that use simple post-processing methods typically available on modern radiology workstations, facilitating the integration of this information into the clinical workflow.

Some embodiments are directed to techniques for performing bone segmentation using magnetic resonance imaging (MRI) data, which can be acquired without using ionizing radiation. The inventors have recognized and appreciated that although osseous tissue itself is typically not visible on conventional MRI scans, bone marrow can provide a strong MR signal. Renderings of the marrow surface, equivalent to the inner surface of cortical bone, may allow assessment of bone morphology via MRI, particularly in areas where cortex is thin (e.g., the epiphyses and metaphyses of long bones). Segmenting bone marrow from other soft tissues is, however, challenging since neighboring musculoskeletal tissue signals, particularly non-bone fat deposits, have similar intensities on images from commonly-employed MRI pulse sequences. For instance, Dixon approaches generate images based primarily on methylene/methyl fat signals and might therefore seem a natural choice for marrow segmentation. However, the retention of subcutaneous fat, intramuscular fat, and fat pads in the "fat-only" images hampers these approaches.

Some previous attempts to segment bone from MR images have used gradient-echo sequences with fat suppression, with bone marrow therefore appearing dark relative to non-fat tissues. Other techniques subtract fat-suppressed from non-fat-suppressed gradient-echo images, resulting in high signal in bone marrow (but also in non-bone fat). Gradient-echo phase rather than magnitude images have also been proposed as a basis for bone segmentation. Acquisition strategies such as those discussed above typically involve either labor intensive manual segmentation or sophisticated segmentation algorithms such as ray casting, level-sets, statistical or active shape modeling, graph-cuts, or support vector machines.

Some embodiments are directed to techniques for bone segmentation based on tissue-specific transverse relaxation properties of the time-domain MRI signal prior to formation of a spin echo. A schematic of a typical spin echo sequence used in MRI is illustrated in FIG. 1. As shown, the RF pulse sequence includes a 90° excitation pulse followed by a 180° refocusing pulse. A spin echo is detected in the MR signal at a particular amount of time called the echo time (TE) following the 90° excitation pulse, where TE depends, at least in part, on the field strength of the magnet used for MRI. The time between sequential excitation pulses is referred to as the repetition time (TR).

In accordance with some embodiments, a set of gradient-echo images is acquired throughout the spin echo, and a bone segmentation image is generated based, at least in part, on at least two images in the acquired set of gradient-echo images. In a beginning (e.g., left) portion of a spin echo, reversible and irreversible transverse relaxation processes are in competition, whereas in a central portion (e.g., right side) of the spin echo or during free induction decay (FID) preceding the refocusing pulse, the reversible and irreversible transverse relaxation properties work in harmony to de-phase tissue signals.

In trabecular bone, susceptibility differences between trabeculae and marrow constituents lead to higher reversible than irreversible relaxation rates. As a result, the MRI signal is low immediately after the refocusing pulse of a spin echo sequence with moderate or long TEs and subsequently increases to a maximum at or near the central portion of the spin echo. Other tissues, including non-bone fatty deposits, have reversible relaxation rates that are smaller than or comparable to the irreversible relaxation rates so that, in contrast to bone marrow, the signal tends to decrease or remain relatively constant throughout the left half of the spin echo. Accordingly, some embodiments are directed to generating a bone segmentation image based, at least, in part, on a first image corresponding to a beginning portion of the spin echo and a second image corresponding to a central portion of the spin echo. For example, a gradient-echo image acquired shortly after the refocusing pulse, on the far left of the spin echo, may be subtracted from a gradient-echo image acquired near the center of the spin echo. Such a subtraction image may show low or negative signal intensity for most tissues but high signal from trabecular bone marrow.

The above-described example of processing multiple gradient-echo images to generate a bone segmentation image involves the use of a subtraction technique. However, in some embodiments, techniques other than subtraction may alternatively be used to generate a bone segmentation image. For example, as discussed in more detail below, one or more parametric maps of reversible relaxation rate may be generated based, at least in part, on a set of gradient-echo images, and the bone segmentation image may be generated based, at least in part, on the parametric map(s).

In some embodiments, contrast between bone marrow and non-marrow in a bone segmentation image may be further enhanced through the choice of gradient-echo spacings that enhance Dixon oscillations resulting from signal oscillations due to interference effects between methylene, methyl, olefinic and water spins going in and out of phase with one another, as discussed in more detail below. High-quality segmentation and surface reconstruction of the marrow surface can then be generated from such bone segmentation images using methods typically available on the picture archiving and communications systems (PACS) workstations used by radiologists, making this an attractive approach for widespread clinical use.

Figure 2:
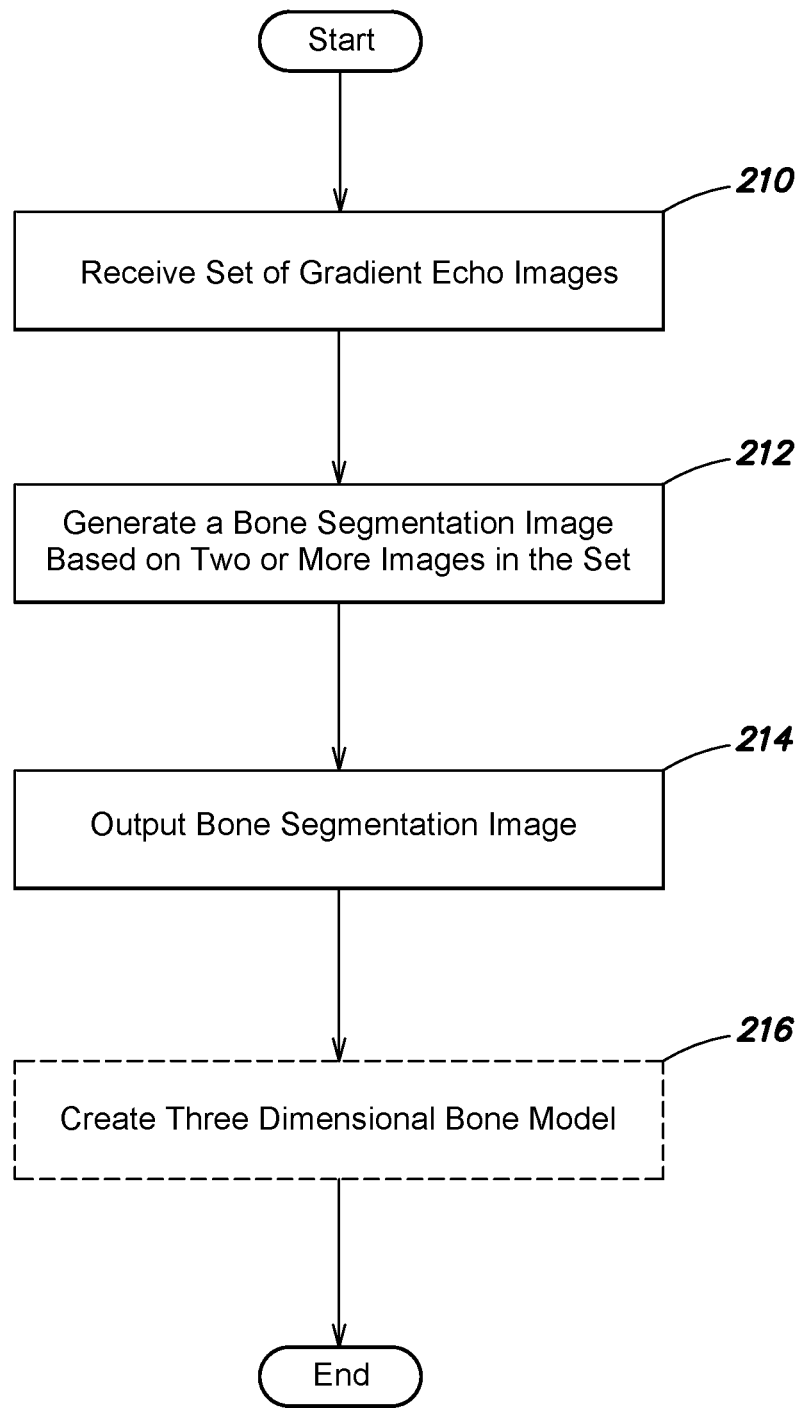
FIG. 2 shows a flowchart of a process for generating a bone segmentation image in accordance with some embodiments.

FIG. 2 shows a process for generating a bone segmentation image in accordance with some embodiments. In act 210, a set of gradient-echo images is received. Any suitable number of gradient-echo images may be included in the set. For example, in some embodiments, the set of gradient-echo images includes 15-31 equally spaced gradient-echo images acquired throughout spin echo using a gradient-echo sampling of the spin echo (GESSE) pulse sequence. The set of gradient-echo images may include fewer than 15-31 images, as embodiments are not limited in this respect. As discussed in further detail below, some embodiments are directed to a modified GESSE pulse sequence that acquires only two gradient-echo images at particular times relative to the spin echo. Acquiring fewer than 15 images may result in a higher signal-to-noise ratio and/or a higher spatial resolution than can be obtained with the standard GESSE pulse sequence, as discussed in further detail below.

Any suitable MRI pulse sequence may be used to acquire the set of gradient-echo images. For example, a GESSE pulse sequence configured to acquire 15-31 gradient-echo images throughout a spin echo may be used. In other embodiments, a gradient-echo sampling of free induction decay and echo (GESFIDE) pulse sequence may be used to acquire the set of gradient-echo images. The inventors have recognized and appreciated that the processing techniques described herein (e.g., image subtraction) used to generate a bone segmentation image enable fewer than 15-31 gradient-echo images as typically acquired in the GESSE and GESFIDE sequences to be acquired. Acquiring fewer gradient-echo images improves the signal to noise ratio by allowing for longer readout times. Alternatively, acquiring fewer gradient-echo images allows for improved spatial resolution as more frequency encodes may be used. In some embodiments, a modified GESSE sequence is used in which only two gradient-echo images are acquired—one during a beginning portion of the spin echo shortly following the refocusing pulse, and another during the central portion of the spin echo.

Figure 3:
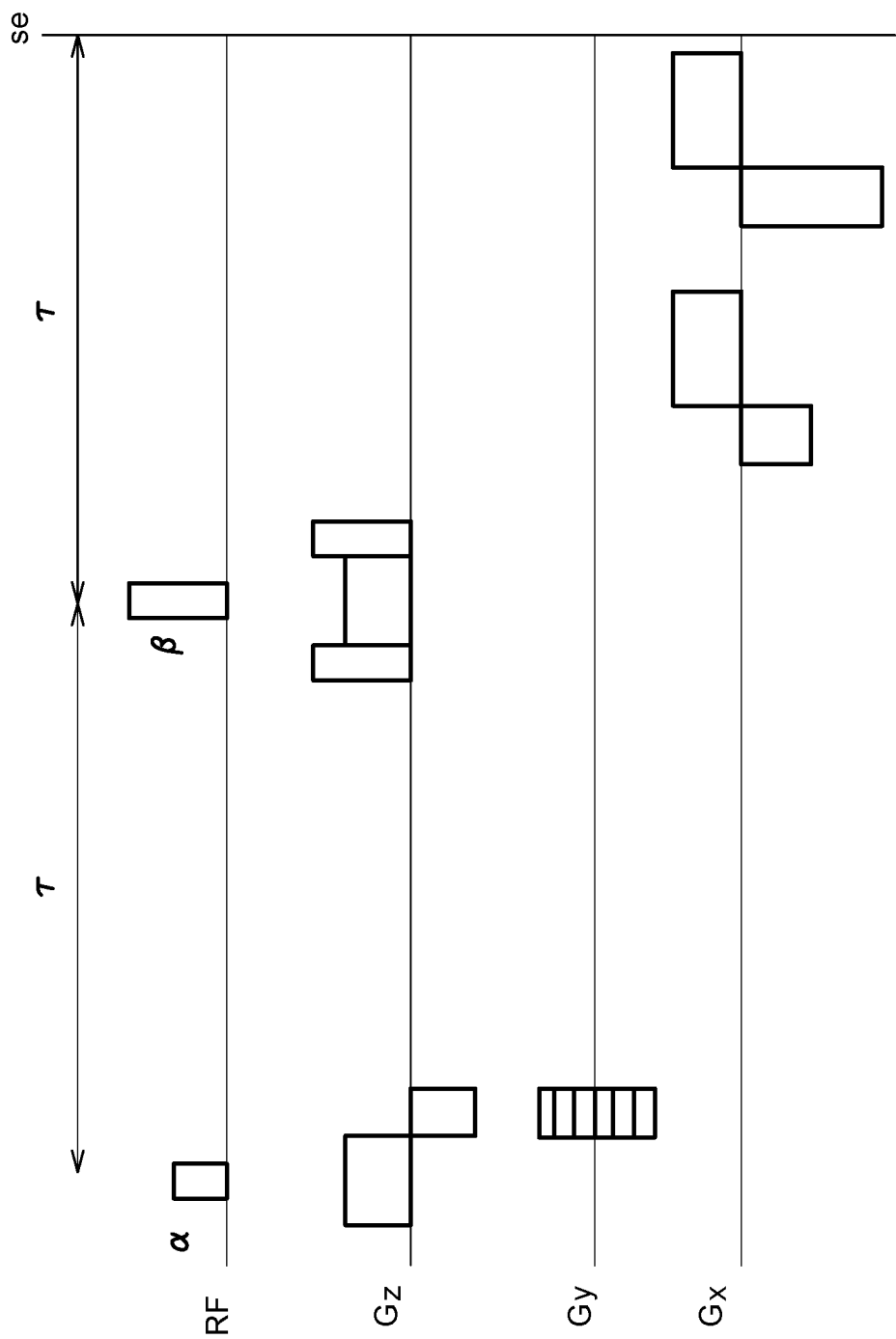
FIG. 3 illustrates a schematic diagram of a modified spin echo sequence that may be used in accordance with some embodiments.

An example of a modified GESSE sequence called "bone only sequence" or BONO is illustrated in FIG. 3. As shown, a BONO sequence may include an excitation RF pulse ($\alpha$) and a refocusing RF pulse ($\beta$) separated by a time ($\tau$). Gradient coils $G_x$, $G_y$, and $G_z$ may also be controlled as shown. At a time $\tau$ following the refocusing pulse a spin echo (SE) is observed, and gradient-echo images—one from the beginning portion of the spin echo close to the refocusing pulse, and one during a central portion of the spin echo, are acquired.

In some embodiments, a three-dimensional GESSE (or BONO) pulse sequence is used to acquire a set of gradient-echo images. The three-dimensional pulse sequence may include slab selective RF pulses and phase encoding in the z-dimension and the y-dimension. Typical GESSE sequences are used only in two dimensions using slice selective RF pulses due to the lengthened scan times needed to accommodate the increased number of phase encodes in the z-direction. However, the inventors have recognized and appreciated that when the pulse sequence is designed to use very short repetition times (e.g., TR values between 50-500 ms), phase encoding in the z-direction is also possible, while maintaining clinically reasonable imaging times. The inventors have shown that short TR values provide adequate SNR from marrow and non-bone fatty deposits while suppressing signal from other tissues with longer T1 values. Using such a sequence, 128×24 phase encodes may be acquired in less than eight minutes with 100 ms TR values. In some embodiments, the scan time may be further reduced using parallel imaging techniques and/or by acquiring fewer gradient-echo images (e.g., using the BONO pulse sequence).

The process then proceeds to act 212, where a bone segmentation image is generated based, at least in part, on two or more images in the set. The selection of images from the set for use in generating the bone segmentation image may be made based, at least in part, on the tissue-specific transverse relaxation properties of the time-domain MRI signal for bone marrow versus non-bone marrow tissues, as discussed above. For example, a first image acquired during the beginning of the spin echo and a second image acquired during the central portion of the spin echo may be selected for use in generating the bone segmentation image, as the difference between these two images reflects differences in transverse relaxation properties of bone marrow and non-bone marrow tissues during their respective times during the spin echo.

In some embodiments, additional factors may also be considered when selecting images from the set to use in generating a bone segmentation image. For example, the inventors have appreciated that selecting a first image acquired during an echo time following the refocusing pulse when fat and water are in-phase and a second image acquired during an echo time following the refocusing pulse when fat and water are out-of-phase may be advantageous to enhance contrast in the bone segmentation image due to the effect of Dixon oscillations, as discussed above.

In some embodiments, a bone segmentation image may be generated using a subtraction technique, where a first image acquired during the beginning of a spin echo is subtracted from a second image acquired during a central portion of the spin echo. Simple subtraction of acquired images is a technique available on most modern radiology workstations, facilitating the integration of the bone subtraction technique into the clinical workflow. In some embodiments, a threshold may be applied to the subtraction image to enhance contrast between bone and non-bone tissue. Any suitable threshold value may be used, and embodiments are not limited in this respect.

In other embodiments, the bone segmentation image may be generated based, at least in part, on one or more parametric maps. For example, a parametric map of reversible relaxation rate may be generated based, at least in part, on at least two images in the set of gradient-echo images, and the bone segmentation image may be generated based, at least in part, on the parametric map. An example of a parametric map that may be generated in accordance with some embodiments, is described in more detail below.

The process then proceeds to act 214, where the bone segmentation image is output. The bone segmentation image may be output in any suitable way, and embodiments are not limited in this respect. In some embodiments outputting the bone segmentation image comprises displaying the bone segmentation image on a display. In some embodiments, a plurality of bone segmentation images are generated for each of a plurality of slices through an imaged anatomical part comprising bone to enable the creation of a three-dimensional representation of the bone structure in the imaged anatomical part, as discussed in more detail below. In some embodiments, a physical model of the bone in imaged anatomical part may be created based, at least in part, on the generated three-dimensional representation.

The process then proceeds to act 216, where a three-dimensional model is optionally created based, at least in part, on a plurality of bone segmentation images. The three-dimensional model may be a computerized model of the bone and/or a physical model of the bone created, for example, using a three-dimensional printer.

Example Simulations and Measurements

The MRI signal during readout time t for a $90_y$–$\tau$–$180_y$–t sequence has been derived from a single Lorentzian distribution of spins centered at $w_0$ with half width at half maximum (HWHM) of $R_2'$, the reversible transverse relaxation rate, and with an irreversible transverse relaxation rate of $R_2$. In the more general case of multiple Lorentzian distributions within a single voxel, such as those due to water, methylene, methyl and olefinic resonances, with each distribution centered at angular frequency $w_{0j}$ and with individual reversible and irreversible relaxation rates $R_{2j}'$ and $R_{2j}$, the spin echo signal during time t is given by:

$$S=-\Sigma_j(m_j/2)\exp(iw_{0j}(\tau-t))\exp(-R_{2j}(\tau+t))\exp(-R_{2j}'|\tau-t|) \quad (1)$$

where $\tau$ is the time between the excitation and refocusing pulses and $m_j$ is the longitudinal magnetization prior to the excitation pulse for species j and is a function of the proton density of species j and appropriate $T_1$-weighting factors. Equation (1) has been derived explicitly on the basis of the assumption of Lorentzian distributions and complete spoiling of transverse magnetization prior to each excitation pulse. Similar closed-form relations have also been derived for Gaussian and uniform frequency distributions. The absolute value in the argument of the exponential of Equation (1) for the $R_{2j}'$ terms reflects the fundamental difference between the left and right sides of a spin echo such that the signal decay, or growth, on the left side is governed by $R_{2j}$–$R_{2j}'$ while the decay on the right side, and prior to the refocusing pulse, is governed by $R_{2j}$+$R_{2j}'$, with no possibility of signal growth. As discussed in further detail below, the mixtures indicated by the summation in Equation (1) cause Dixon oscillations in the signal time courses, as spins with different resonance frequencies go in and out of phase—a feature that can be leveraged in some embodiments to generate high-quality segmentation of bone marrow.

In order to simulate signal time courses using Equation (1), the time $\tau$ between the excitation and refocusing pulses was specified as 40 ms, corresponding to a spin echo with an echo time (TE) of 80 ms. Several tissue parameters were also be specified as follows: for both bone marrow and non-bone fatty tissues, it was assumed that four resonances contribute to Equation (1), with 80% methylene at 0 Hz (on-resonance), 7.5% methyl at −26 Hz, 7.5% olefinic protons at 265 Hz, and 5% water protons at 220 Hz off-resonance, assuming a field strength of 1.5 T. For muscle, a single water resonance at 220 Hz was assumed. The $R_2/R_2'$ values for bone marrow, non-bone fat, and muscle were chosen to be 15/60 s$^{-1}$, 15/10 s$^{-1}$ and 30/2 s$^{-1}$, respectively. A tacit assumption that the four different resonances of the fatty tissues share the same $R_2$ and $R_2'$ values was also made. These $R_2$ and $R_2'$ values were selected for simulation as they are representative of those estimated from measurements discussed in more detail below. The relative weights of the contributing spin species are representative of those observed in proton spectra of yellow marrow in the knee, while red marrow in pediatric subjects or in certain locations in adults, e.g., vertebrae, will contain a higher percentage of water protons.

Human volunteer studies were performed on a 1.5 T Avanto scanner (Siemens Medical Systems, Erlangen, Germany) under the auspices of a protocol approved by the local institutional review board which included written informed consent. The left knee of a healthy 52 year old male volunteer was scanned using the standard clinical 15-element knee coil for reception and using the body coil for transmission. The gradient-echo sampling of the spin echo (GESSE) sequence, with 15 equally-spaced unipolar gradient-echo readouts and with the eighth gradient-echo coinciding with the spin echo, was used with one of two parameter settings: for the first setting, the spacing of the gradient-echoes was $\Delta TE$=4.64 ms (with a pixel bandwidth of 250 Hz/pixel and the spin echo at TE=80 ms), whereas for the second setting, the gradient-echoes were spaced at $\Delta TE$=2.44 ms (with a pixel bandwidth of 574 Hz/pixel and the spin echo at TE=40 ms). For $\Delta TE$=4.64 ms, methylene/methyl and the water/olefinic resonances are expected to be largely in-phase at 1.5 T for each gradient-echo, whereas for $\Delta TE$=2.44 ms, an in-phase gradient-echo is expected to be followed by an out-of-phase gradient-echo, with the above considerations based on differences between methylene/methyl and water/olefinic proton resonance frequencies being in the range of 220-260 Hz at 1.5 T. Stated differently, plots of signal magnitude versus echo time from voxels in marrow or non-bone fat deposits were expected to exhibit more pronounced Dixon oscillations for the 2.44 versus 4.64 ms echo spacing. For both of the above parameter settings, data sets were acquired with TR=2 s, 16 sagittal slices with 5/2.5 mm slice thickness/gap, 192×256 mm² in-plane field of view (FOV) and 96×128 matrix, with the frequency-encoding direction running head to foot and the phase encoding direction running anterior to posterior, providing full coverage of the knee with a three minute acquisition time. In addition to the GESSE sequence, non-water-suppressed, single-voxel proton spectra were acquired with the double-echo point resolved spectroscopy (PRESS) sequence with TE=30 ms, TR=2 s, and 32 signal averages from 1 cm³ voxels within muscle, bone marrow and non-bone fat regions.

Maps of R2 and R2' were generated from the GESSE data. For each voxel, straight lines were fitted separately to data (i.e., the logarithm of signal magnitude versus echo time) from either side of the spin echo, with the left-side slope providing an estimate of R2−R2' and the right-side slope providing an estimate of R2+R2', under the assumption of a single Lorentzian distribution of frequencies. Given these estimates, the values of R2 and R2' were then derived. The fits were performed in MATLAB (Natick, Mass., USA), using the "regress" function.

Bone marrow surfaces were generated via the following four operations: (i) images corresponding to the second GESSE echo were subtracted from images corresponding to the seventh echo, with the rationale for this particular choice of echoes provided below, (ii) a suitable threshold was chosen in order to binarize the images, (iii) triangular-mesh surfaces were generated from the binary images using the "isosurface" function in MATLAB, and (iv) the surface was smoothed by iteratively moving each vertex towards the centroid of its neighbors in order to reduce the "blockiness" resulting from the thick slices used in this illustrative experiment.

Figure 4A:
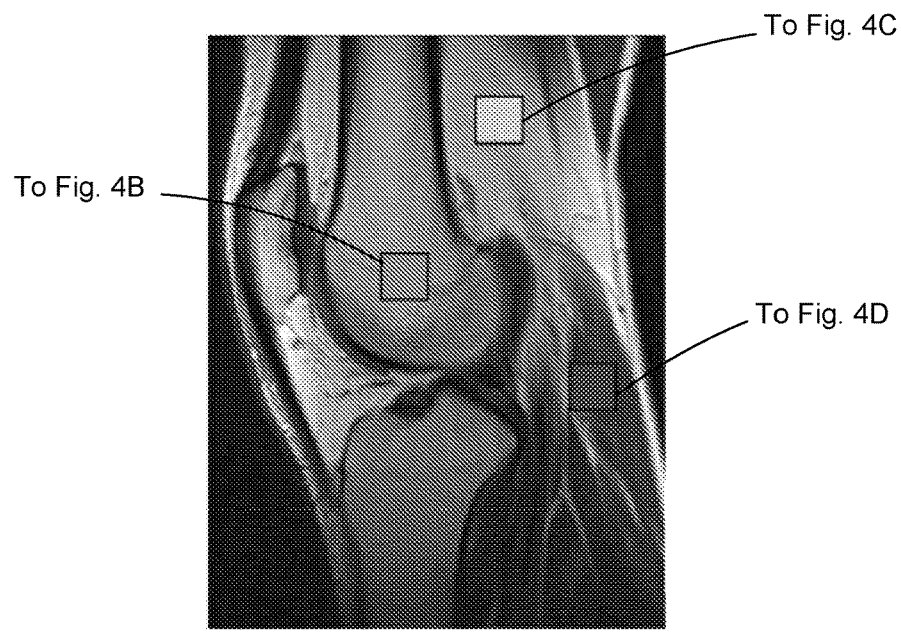
FIGS. 4A-4D show a localizer image (A) and single-voxel non-water suppressed proton spectra for trabecular bone marrow (B), non-bone fat (C), and muscle (D) in accordance with some embodiments.
Figure 4B:
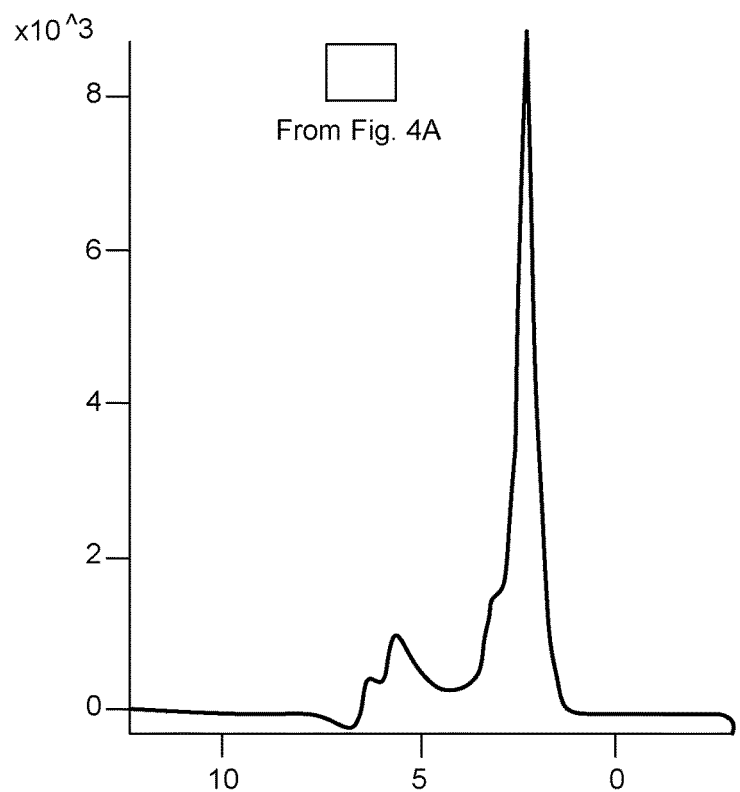
Figure 4C:
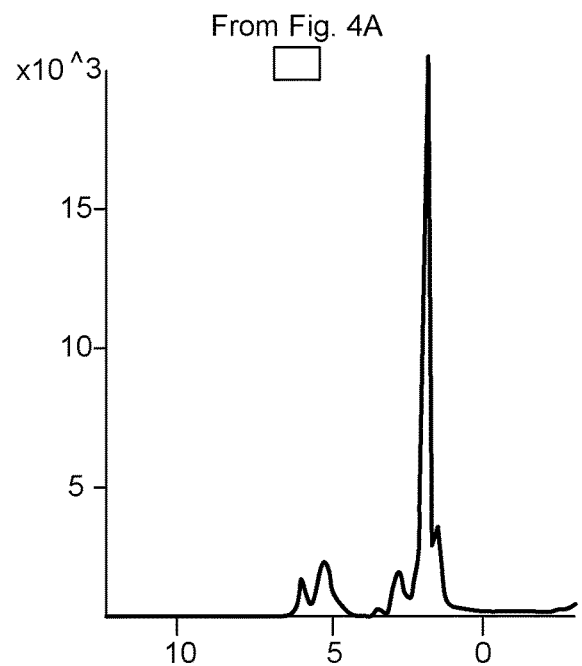
Figure 4D:
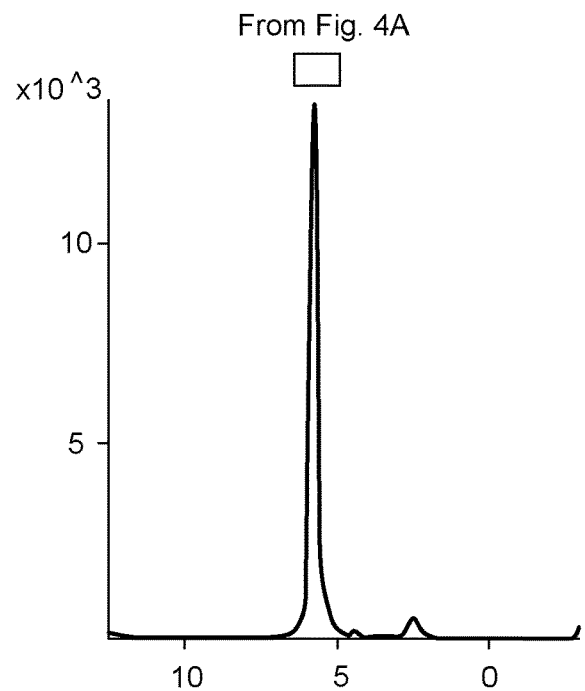

FIG. 4A show a localizer image in which multiple voxels are indicated. FIGS. 4B-4D show the non-water-suppressed proton spectra from 1 cm³ voxels in trabecular bone marrow, non-bone fatty deposits, and muscle for the voxels indicated in the localizer image of FIG. 4A. These results presage the GESSE data from these locations in that (i) muscle spectra show a predominant and narrow water resonance line with only a small fat peak (FIG. 4D), (ii) non-bone fat spectra show multiple, narrow lines with a predominant resonance from methylene protons but with a resolvable methyl proton peak and clearly separated water and olefinic peaks (FIG. 4C), and (iii) bone marrow spectra show similar lipid and water resonances as non-bone fat but with considerably broadened linewidths and a subsequent loss of the spectral resolution between the methylene/methyl resonances and the olefinic/water resonances (FIG. 4B). The broadening of the linewidths in bone marrow compared to non-bone fat implies larger reversible relaxation rates in the former and the multiple lines (>4) from the lipid resonances and the water resonance guarantee complex Dixon oscillations in both fatty tissues.

Figure 5:
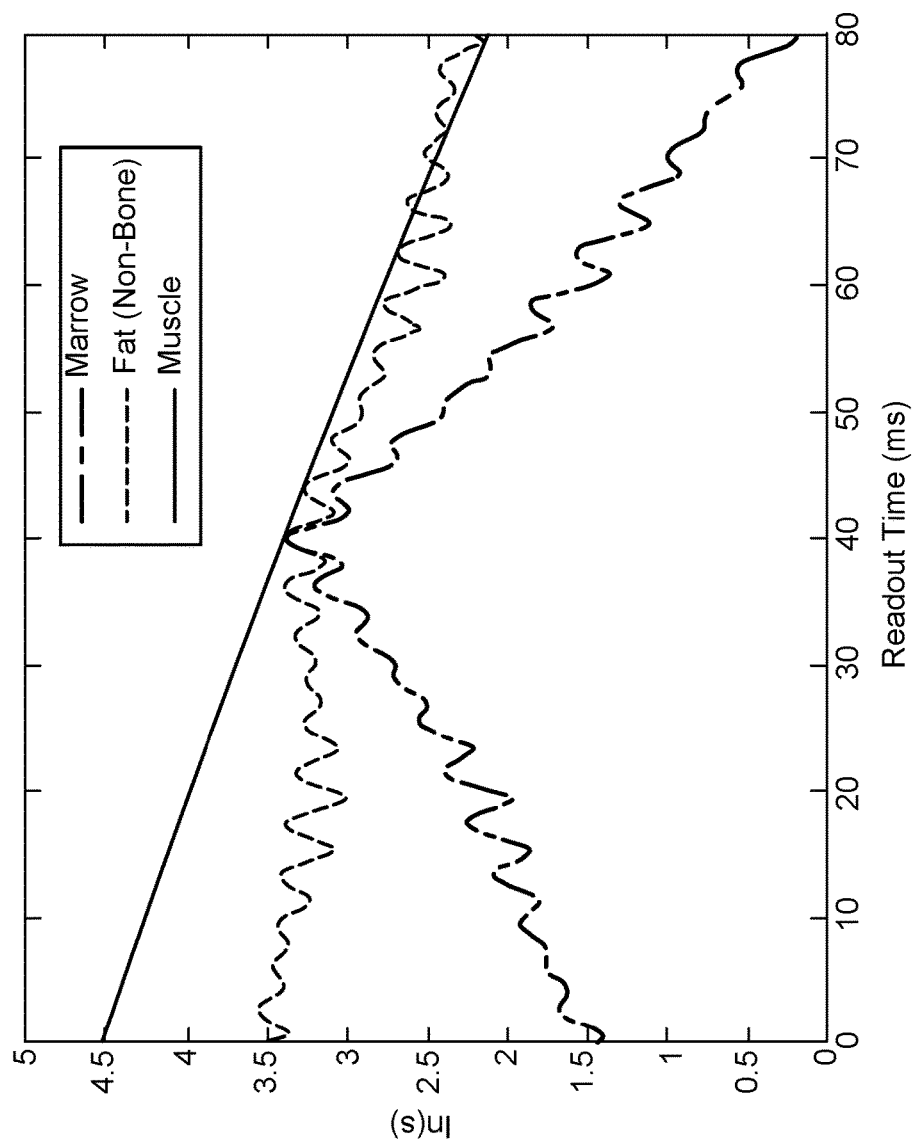
FIG. 5 shows simulations of the natural logarithm of the magnitude signal, ln(S), as a function of readout time through a spin echo, in accordance with some embodiments.
Figure 6A:
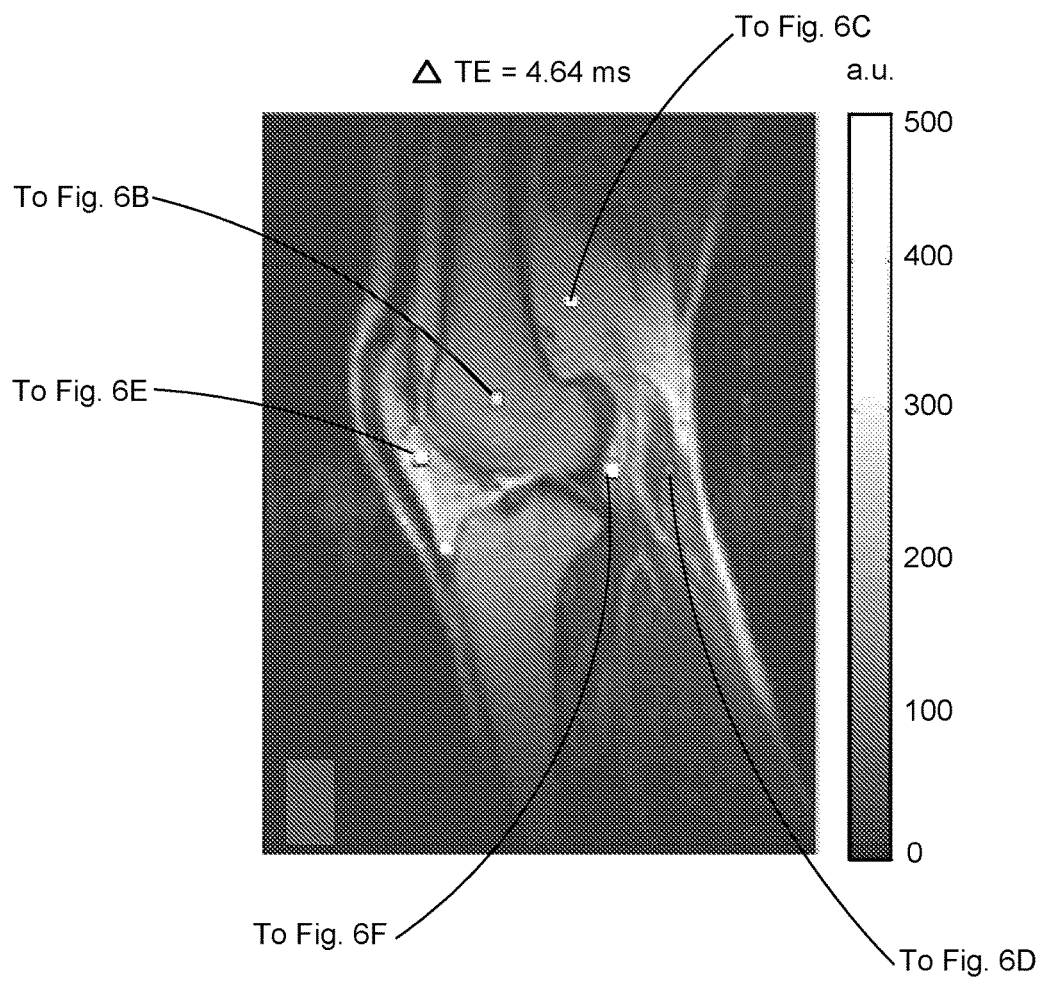
FIGS. 6A-6F show a GESSE data set acquired throughout a spin echo with a gradient-echo spacing of $\Delta TE=4.64$ ms.
Figure 6B:
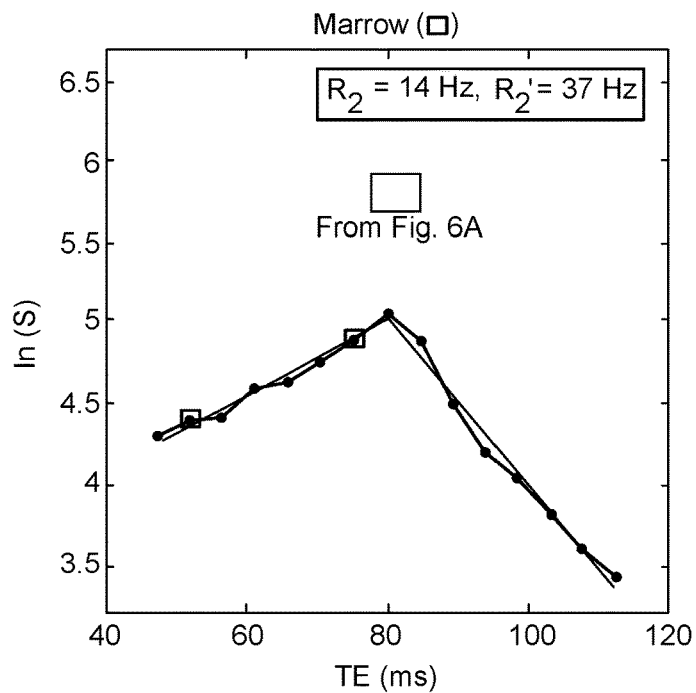
Figure 6C:
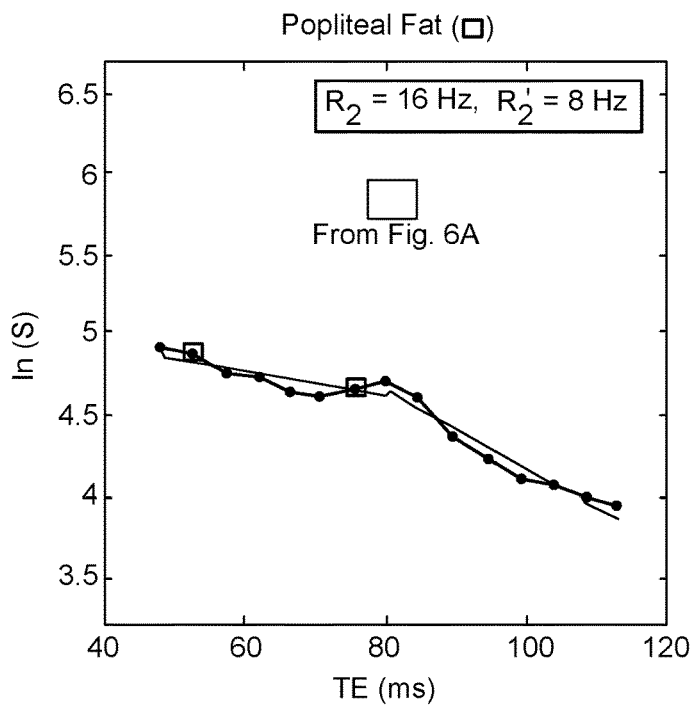
Figure 6D:
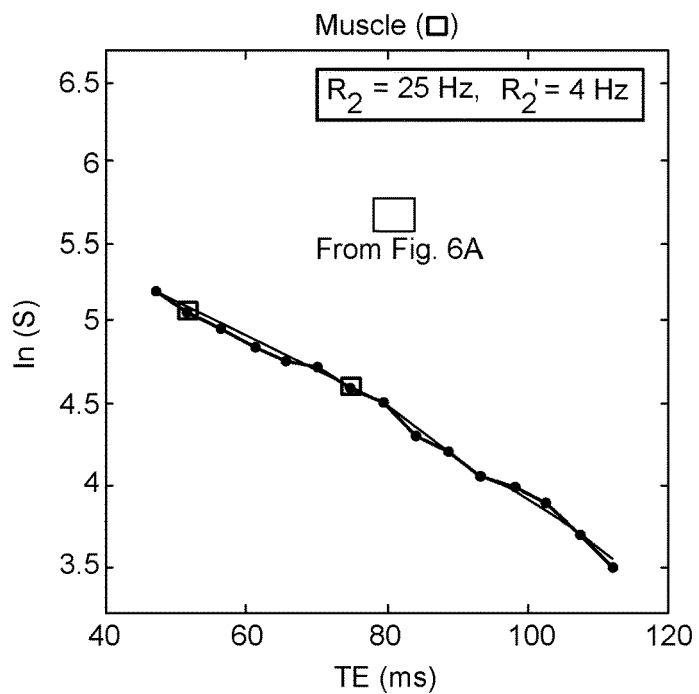
Figure 6E:
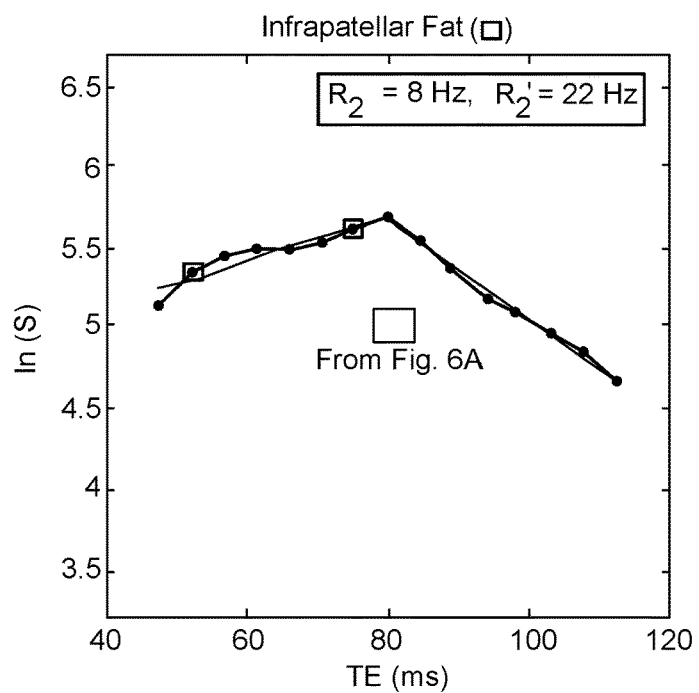
Figure 6F:
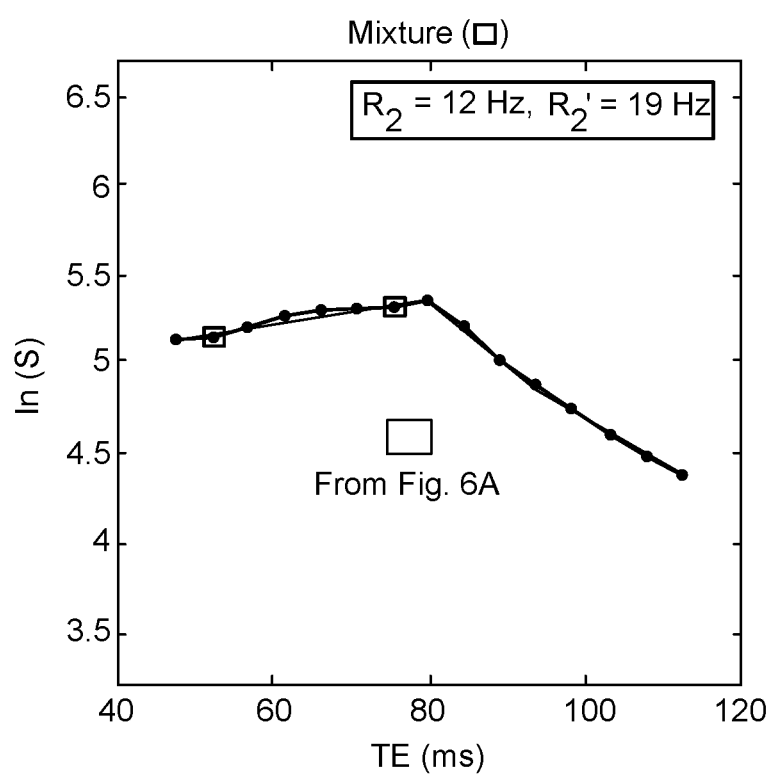
Figure 7A:
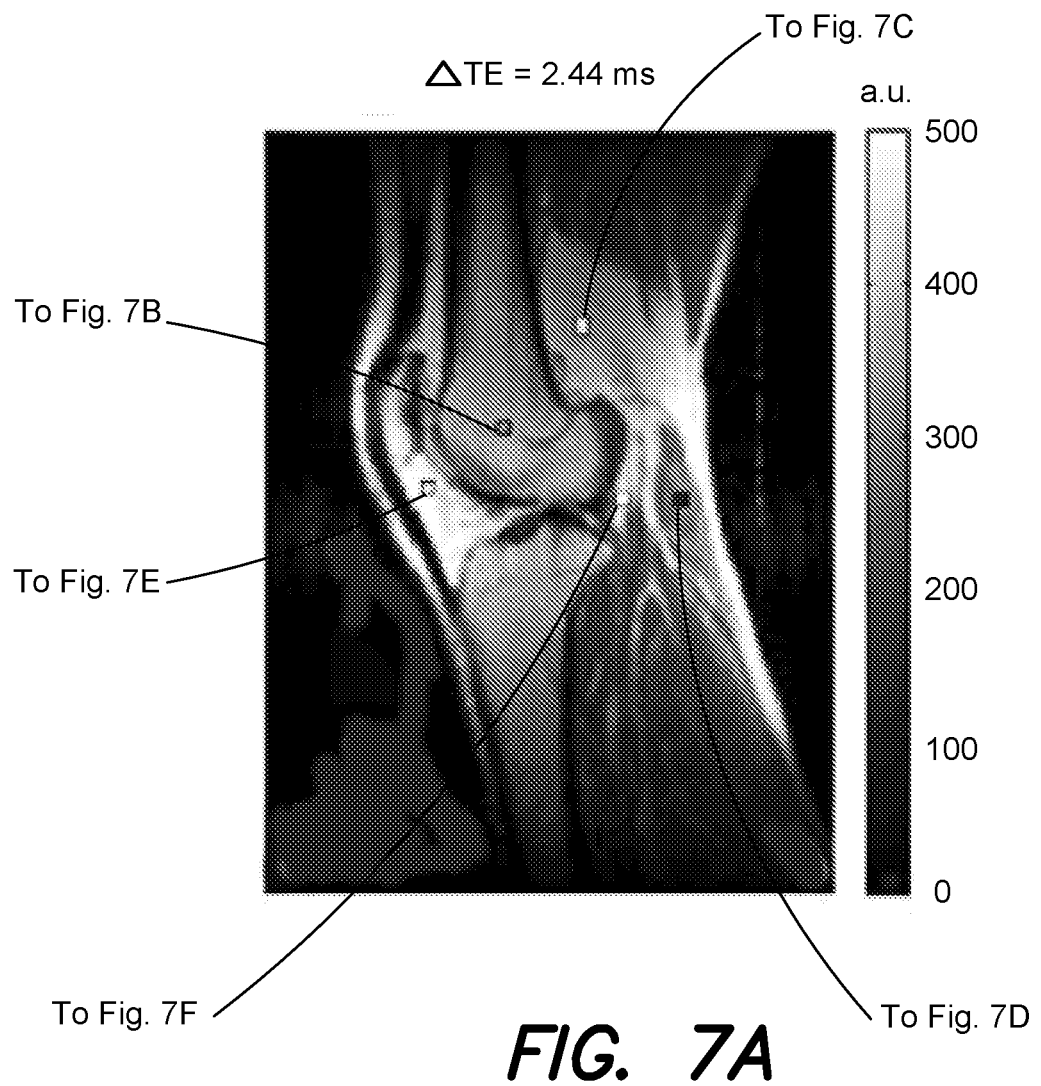
FIGS. 7A-7F show a GESSE data set acquired throughout a spin echo with a gradient-echo spacing of $\Delta TE=2.44$ ms.
Figure 7B:
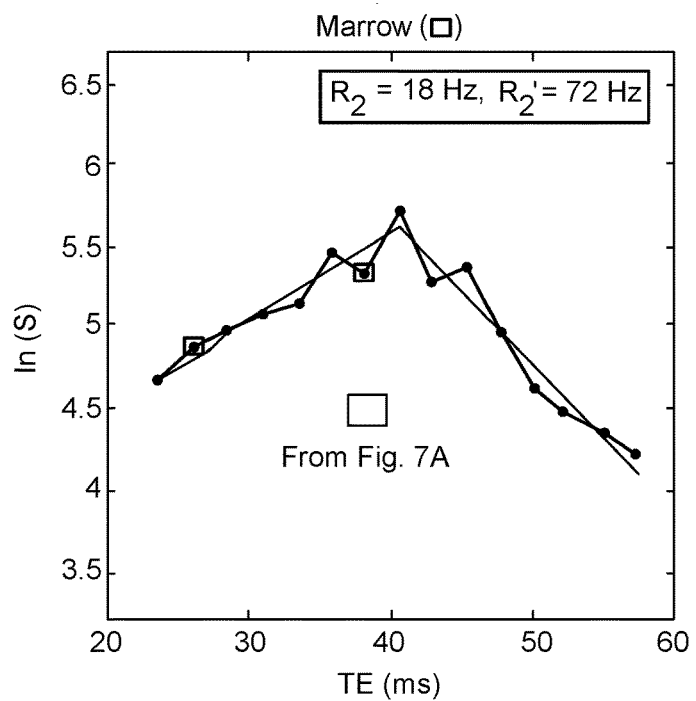
Figure 7C:
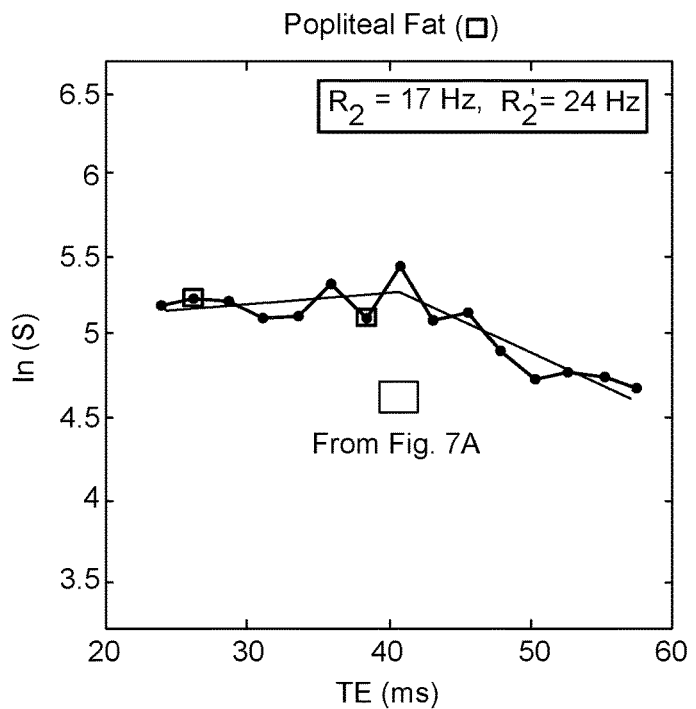
Figure 7D:
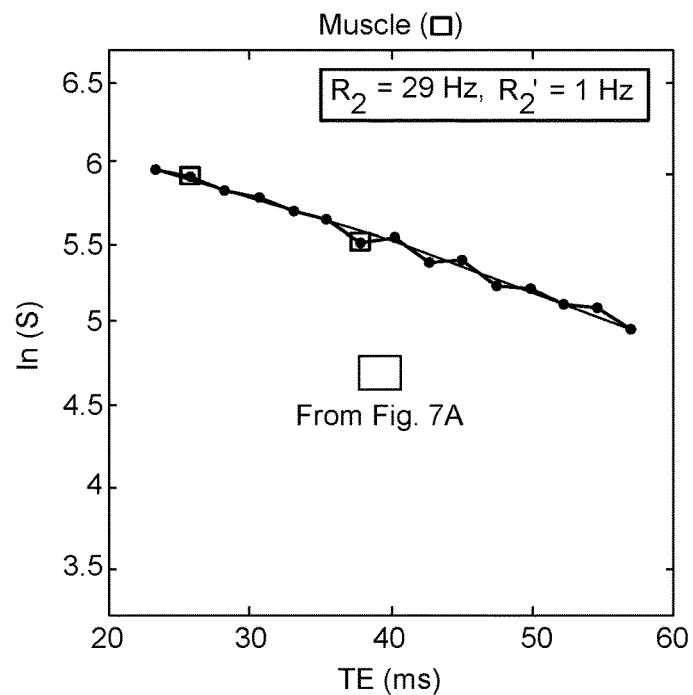
Figure 7E:
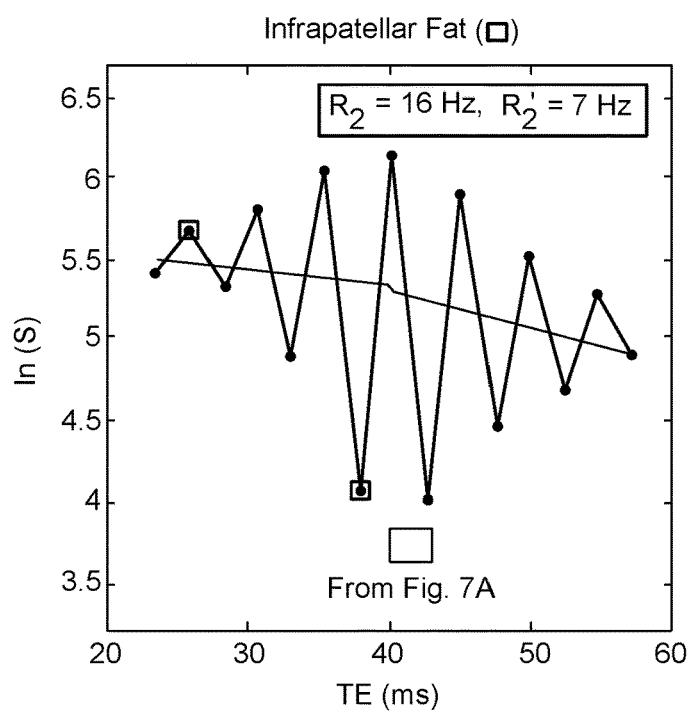
Figure 7F:
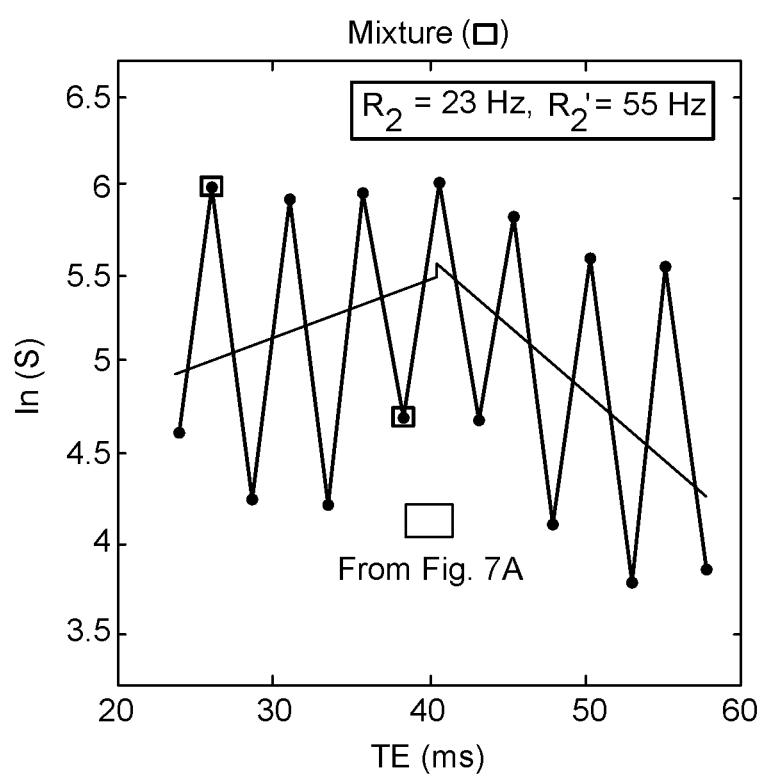
Figure 8A:
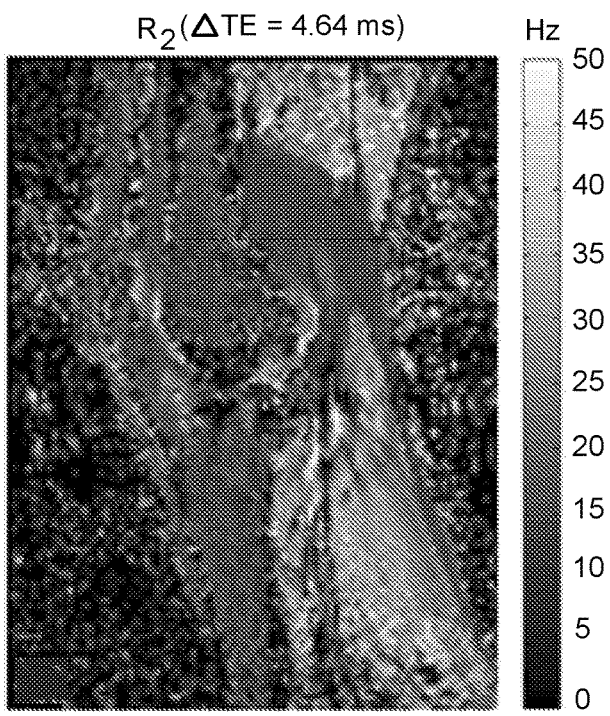
FIGS. 8A-8D show parametric maps that may be generated in accordance with some embodiments.
Figure 8B:
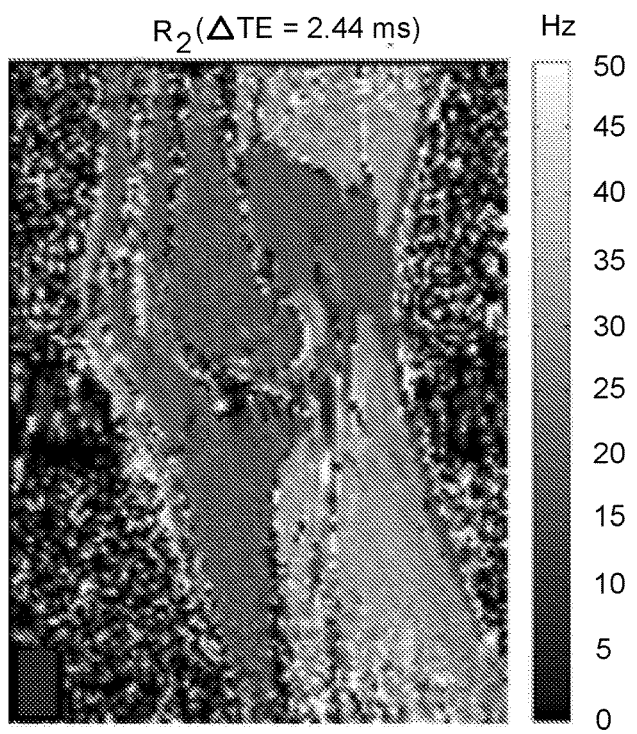
Figure 8C:
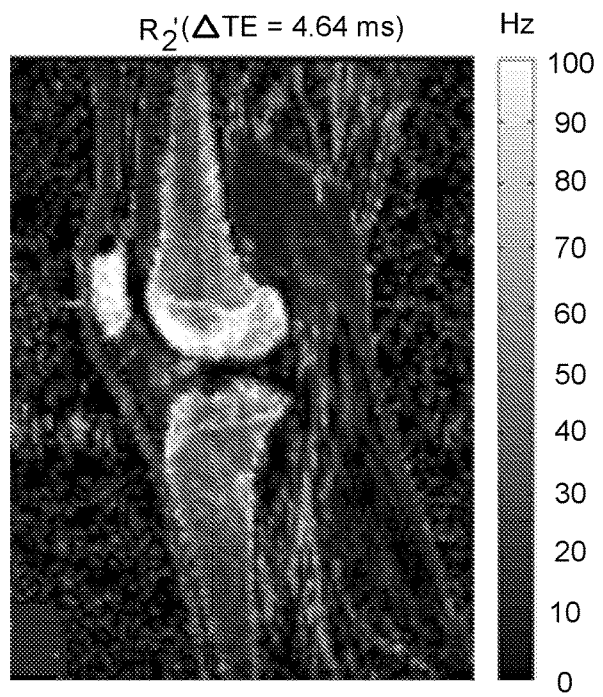
Figure 8D:
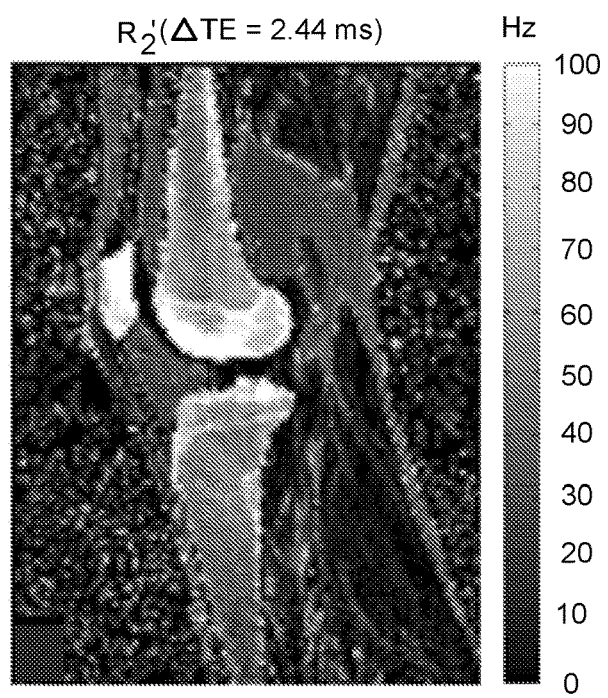

FIG. 5 shows simulated time courses through the spin echo for three major tissues of interest—bone marrow, non-bone fatty deposits, and muscle—as calculated using Equation (1) with the choice of tissue parameters described above. The muscle signal decays monotonically throughout the spin echo since R2>R2' but with slightly different slopes before and after the spin echo. Ignoring the oscillations in the fatty tissue signals, the non-bone fat deposit signal, with fairly similar R2 and R2' values, shows a relatively flat response during the first half of the spin echo followed by decay during the second half of the spin echo. The bone marrow signal, on the other hand, shows strong growth throughout the first half of the spin echo with even more rapid decay during the second half, characteristic of tissues in which R2' values exceed R2 values. Superimposed on these growth and decay curves are Dixon oscillations due to interference between the resonances at different frequencies. The higher frequency oscillations with a period of around 4.5 ms are attributed to the interference between the large methylene/methyl signals and the smaller resonances from olefinic and/or water protons. The interference between the olefinic and water protons results in a slower oscillation of ~30 ms—a "beat" pattern on top of the higher frequency oscillations. A slow oscillation with a ~38 ms period also arises from the methylene/methyl interference. The simulated time courses of FIG. 5 are based on effectively continuous sampling, which is not how imaging sequences such as GESSE acquire data, with typical gradient-echo spacings in the 2-5 ms range. From the continuously-sampled curves of FIG. 5, it becomes clear that the sampling rate, or gradient-echo spacing ΔTE, plays a major role in the actual signals observed throughout the spin echo for the fatty tissues.

FIGS. 6 and 7 show GESSE time course data from the healthy knee using echo spacings of 4.64 ms and 2.44 ms, respectively, largely confirming the results of the simulations. For both echo spacings, muscle signal decreases monotonically throughout the spin echo with slightly different slopes on either side of the spin echo, whereas signal from bone marrow increases on the left side of the spin echo and signal from non-bone popliteal fat is relatively flat on this side. In voxels containing fat, high-frequency oscillations are considerably subdued with ΔTE=4.64 ms (FIG. 6) but are observed quite prominently with ΔTE=2.44 ms (FIG. 7). Lower-frequency oscillations remain for the ΔTE=4.64 ms data (e.g., see FIG. 6C), however, and are tentatively attributed to the methylene/methyl interference phenomenon.

The solid lines fitted to the data in FIGS. 6 and 7 show the results of fitting straight lines to the left and right sides of the spin echo; estimates of R2 and R2' are obtained from the slopes of these lines. Clearly with the 2.44 ms gradient-echo spacing, Dixon oscillations adversely affect the quality of the fits and hence the R2 and R2' estimates, although this may be improved with strategies such as fitting to just the even-numbered echoes. With the oscillations subdued for ΔTE=4.64 ms, better fits and therefore better estimates of the relaxation rates are obtained. Indeed the rationale for using ΔTE 4.6 ms for simultaneously measuring R2 and R2' was to avoid methylene and water chemical shift interference effects. However, the situation is somewhat more complex, since when more than two components exist, as in bone marrow and non-bone fatty deposits, there will be no single gradient-echo spacing that completely removes Dixon oscillations.

By repeating the fitting procedure for each voxel, R2 and R2' maps can be generated, as shown in FIG. 8. In general, the R2 maps for both echo spacings were quite similar, other than slightly larger R2 values in fatty tissues for ΔTE=2.44 ms. The R2' maps were significantly different, however, as is particularly evident in the non-bone fat deposits, suggesting that Dixon oscillations in the ΔTE=2.44 ms echo data differentially impact the estimation of R2 and R2'.

Figure 9A:
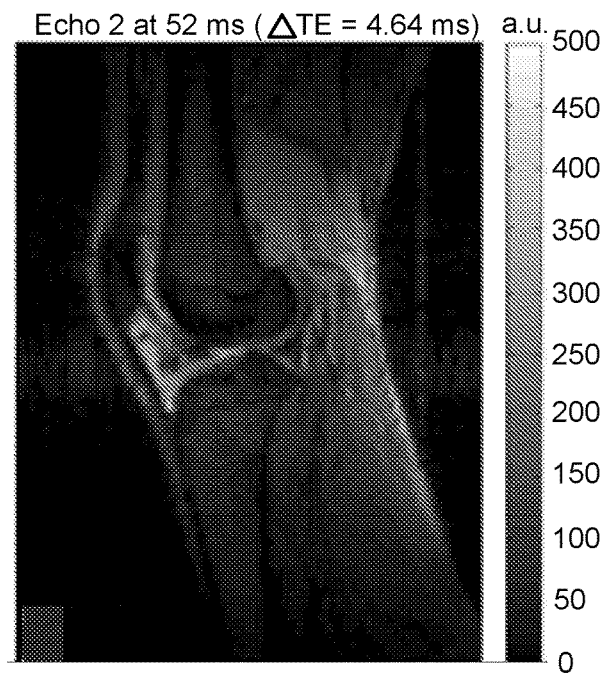
FIGS. 9A-9F show gradient-echo images and bone segmentation images that may be generated in accordance with some embodiments.
Figure 9B:
Figure 9C:
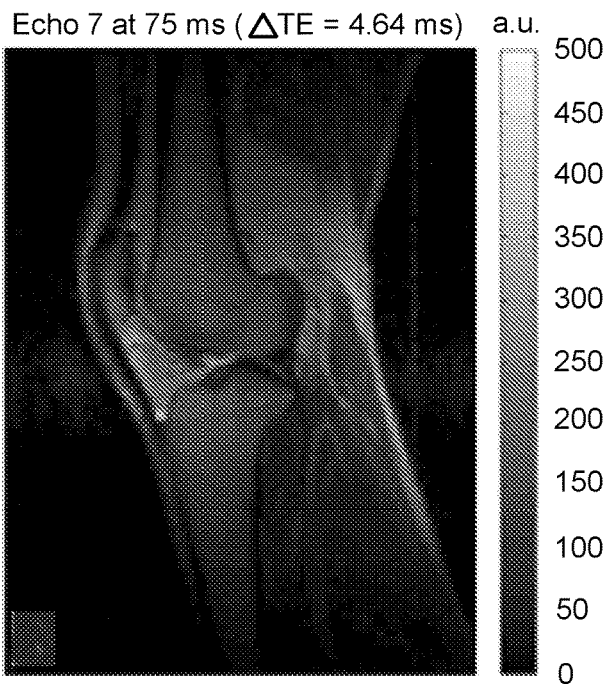
Figure 9D:
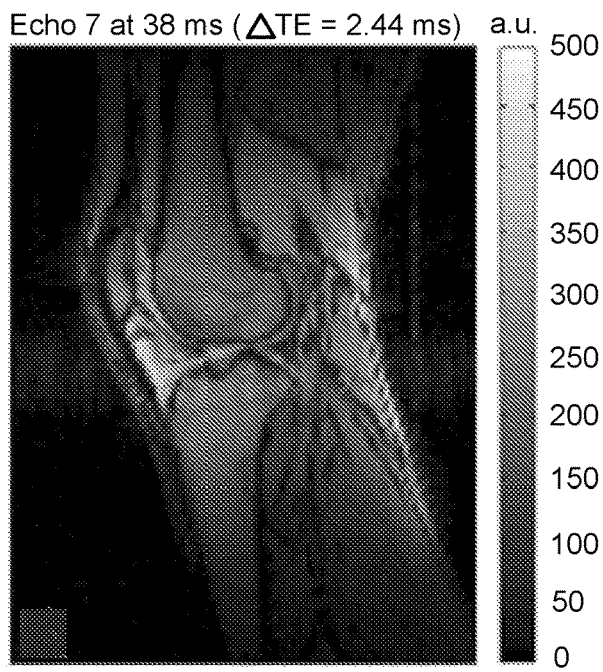
Figure 9E:
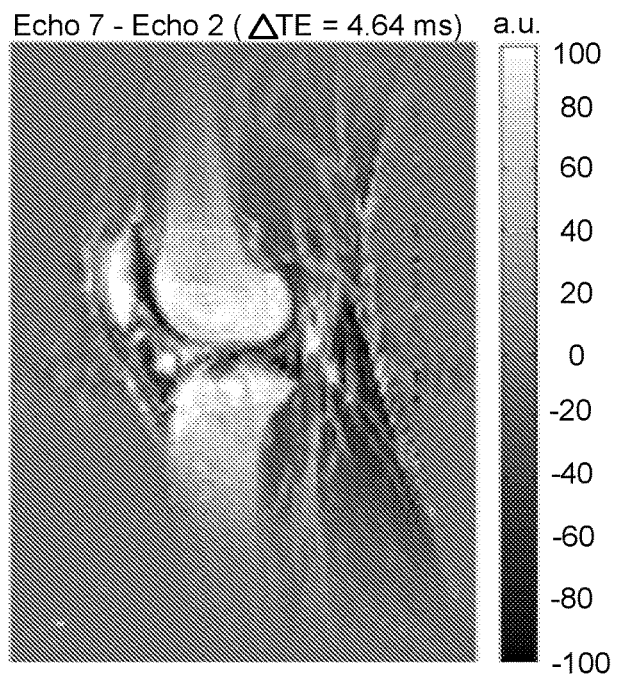
Figure 9F:
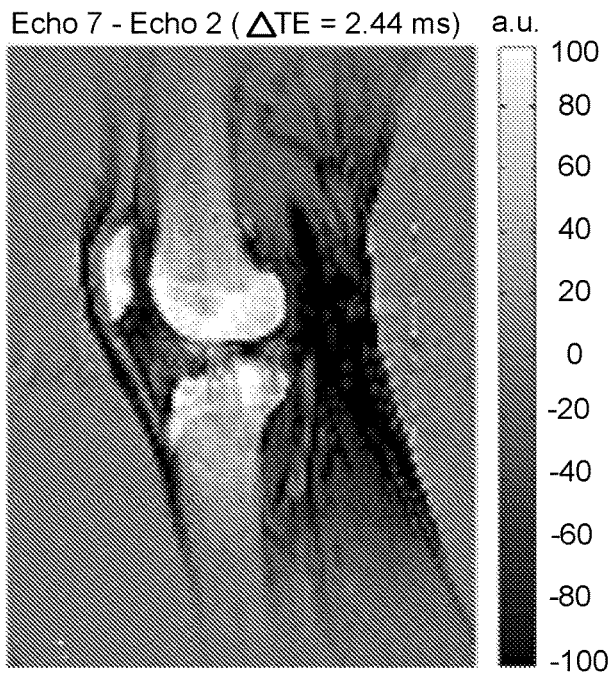

However, the Dixon oscillations in the ΔTE=2.44 ms acquisition provide an excellent strategy for bone marrow segmentation via operations as simple as image subtraction and thresholding. Shown in FIG. 9 are the second and seventh GESSE echoes from the ΔTE=4.64 ms acquisition (FIGS. 9A and 9C) and the ΔTE=2.44 ms acquisition (FIGS. 9B and 9D), along with the corresponding subtraction images (FIGS. 9E and 9F). Bone marrow clearly stands out from the surrounding tissues in the ΔTE=2.44 ms subtraction image (FIG. 9F).

Figure 10:
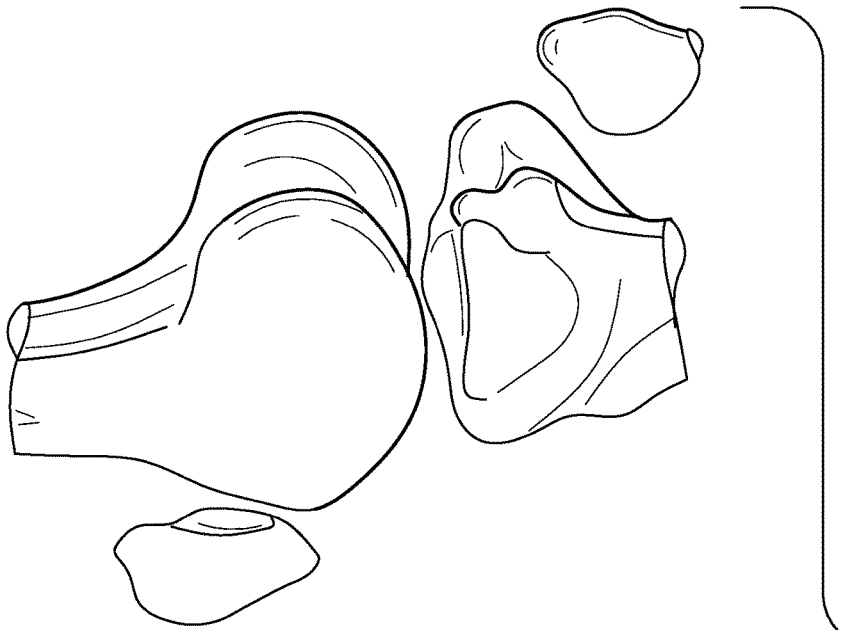
FIG. 10 shows a three-dimensional representation of bone that may be created in accordance with some embodiments.
Figure 10:
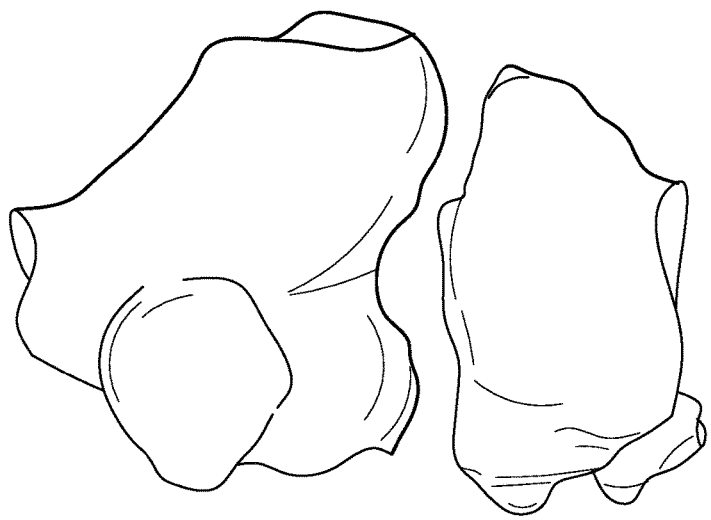

The application of a threshold of 30 (arbitrary units) to the subtraction images (seventh echo–second echo) from all slices in the ΔTE=2.44 ms GESSE data, followed by surface reconstruction and smoothing resulted in the three-dimensional rendering shown in FIG. 10. Note that the distal femur, patella, proximal tibia and fibula can all be easily identified, with the morphology of the distal femoral condyle readily appreciated in such renderings.

As discussed above, some embodiments take advantage of both Dixon oscillations and the reversible/irreversible transverse relaxation properties of bone marrow to facilitate the segmentation of bone marrow from other musculoskeletal tissues. For signals from non-bone fatty deposits and on the left side of the spin echo, Dixon oscillations ride on top of a relatively flat signal, since the R2 and R2' values are similar, and therefore subtracting an in-phase gradient-echo from an out-of-phase gradient echo can result in negative signal intensities in the subtraction image. For signals from bone marrow, R2' being much greater than R2 means there is an overall signal growth on the left side of the spin echo, and therefore subtracting a gradient-echo from the far left of the spin echo from a gradient-echo near the spin echo results in highly positive intensities in these tissues. For signals from muscle, R2' being much smaller than R2 leads to signal decay on the left side of the spin echo, and so subtracting a gradient-echo to the far left of the spin echo from a gradient-echo near the spin echo results in highly negative intensities. Therefore, in data such as that from the ΔTE=2.44 ms GESSE acquisition (FIGS. 7A-7F), separating bone marrow from surrounding tissues is achieved by subtracting an early, even-numbered gradient-echo from a middle, odd numbered gradient-echo, explaining the rationale for choosing the second and seventh gradient-echoes for subtraction and the consequent high-quality segmentation results shown in FIGS. 9 and 10.

Three-dimensional rendering of the bone marrow surface, e.g., using the techniques described herein provides a three-dimensional rendering of the inner surface of cortical bone structures. This may allow a sufficiently accurate assessment of overall bone morphology in areas where the cortex is thin, such as the epiphyses and metaphysis of long bones such as the femur, the focus of much attention for the assessment of congenital and developmental hip disorders. With CT, the high signal from cortical bone means that its outer surface is easily reconstructed, providing a more accurate representation of the actual bone shape, especially in areas where the cortex is thick, such as the mid-diaphysis of long bones. To do something similar with MRI may require generating substantial signal from cortical bone, which only has a small percentage (~20%) of protons. In addition, the extremely short T2* values (<0.5 ms) of these protons makes cortical bone extremely challenging to image, requiring the use of ultra-short echo time (UTE) pulse sequences. Although demonstrations of cortical bone imaging with UTE have been shown, typically of the thick cortical bone sections in tibia, the technical difficulties associated with imaging short T2* tissues have also been identified. Briefly, these include poor point-spread functions, difficulties in excitation (in both 2D and 3D formats), discounting the overwhelming non-cortical-bone signal from longer T2* species and considerably more stringent hardware requirements.

An alternative strategy for reconstructing the outer surface of cortical bone is to initialize a boundary-growing procedure with the inner surface (e.g., as provided using the techniques described herein): this surface could then be extended outwards through the signal void presented by cortical bone in the images (and in other common MR images), until it intersects the image-intensity edges corresponding to the boundary between cortical bone and the various signal-bearing tissues surrounding bone. With both the inner and outer surfaces of cortical bone in hand, it becomes possible to make assessments of bone strength or fracture risk using finite element analysis, as is often done with bone surfaces generated from CT data. Incorporating bone mineral density (BMD) into the analysis has been shown to improve the prediction of bone strength. Since R2' is sensitive to BMD, combining R2' measures with bone surface geometry could similarly lead to improved prediction of bone strength or fracture risk within a purely GESSE-based framework.

As should be appreciated from the foregoing discussion, the degree to which MRI acquisition methodology can separate bone marrow from other tissue types determines whether or not methods based on simple thresholding can be used for segmentation, rather than manual segmentation or methods involving complicated algorithms. Differences in the reversible transverse relaxation of bone marrow and the other soft tissues in the musculoskeletal system, used alone, or combined with Dixon oscillation information, offer a unique approach to bone marrow segmentation with MRI.

Figure 11:
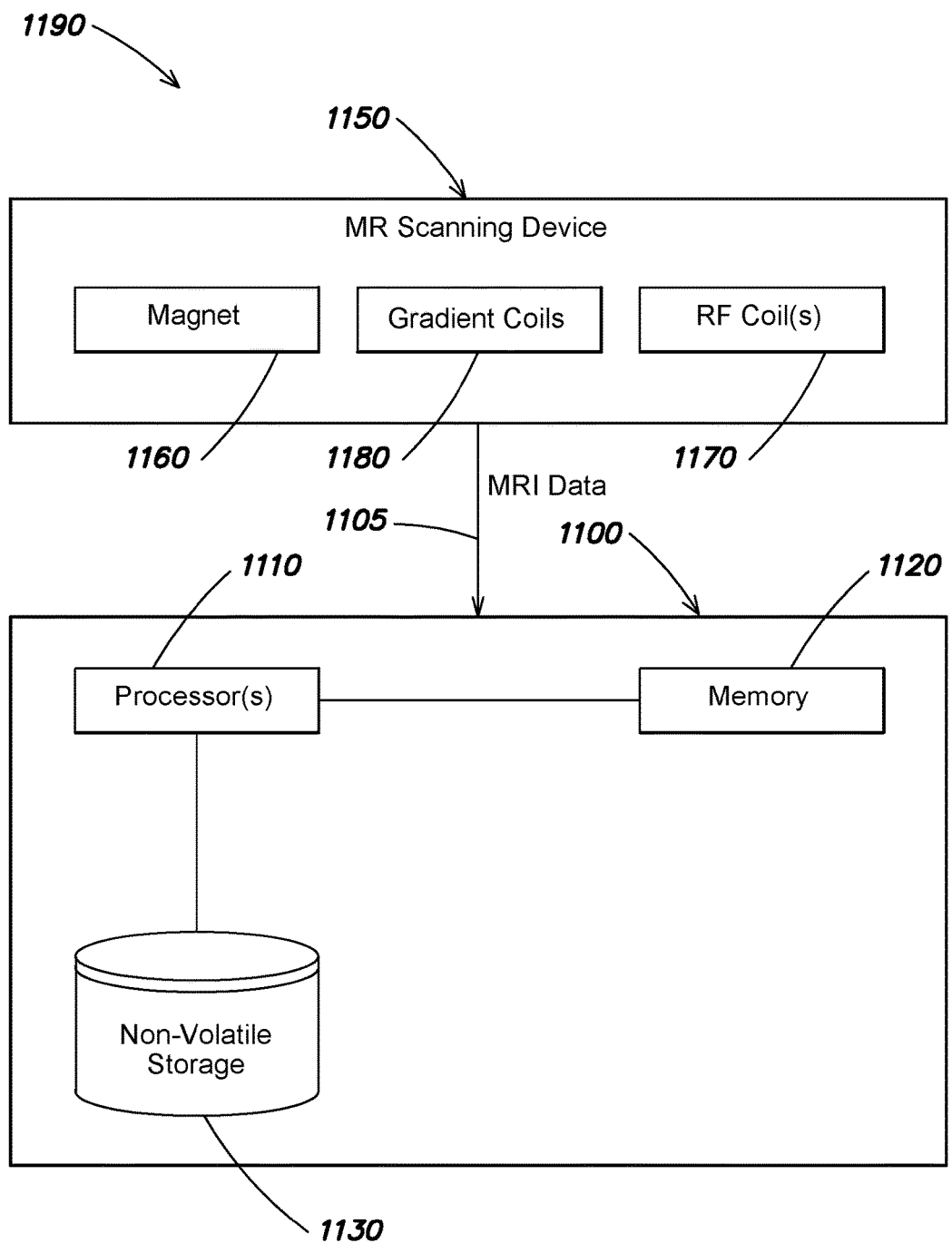
FIG. 11 illustrates a MR scanning device suitable for obtaining MRI data in accordance with some embodiments.

FIG. 11 illustrates a block diagram of one embodiment of a system 1190 suitable for practicing various techniques described herein. System 1190 comprises a magnetic resonance (MR) scanning device 1150 and computer system 1100. MR scanning device 1150 may be any device capable of obtaining MR data and, in particular, capable of acquiring gradient-echo image data. For example, MR scanning device 1150 may include a magnet 1160 capable of producing a magnetic field of desired strength, and may produce a uniform or gradient magnetic field. Magnet 1160 may be of any shape, size and strength and may include multiple magnets of any size, shape and strength.

MR scanning device 1150 also comprises one or more RF coils 1170 arranged proximate the magnet and adapted to provide RF pulse sequences to an object being scanned and/or to detect NMR signals (e.g., gradient-echo signals) emitted therefrom. RF coils 1170 may comprise one or multiple coils arranged in any configuration to perform single coil acquisition or multiple coil acquisition (i.e., parallel MR). RF coils 1170 may include independent RF coils for providing RF pulse sequences (excitation coils) and detecting NMR signals (receive coils), or one or more RF coils may be arranged as both an excitation and receive coils.

MR scanning device 1150 also comprises a plurality of gradient coils configured to enable encoding of frequency and/or phase in one or more of the x-direction, y-direction, and z-direction. Any configuration of magnet 1160, RF coil(s) 1170, and gradient coils 1180 may be suitable, as the techniques described herein are not limited for use on data obtained from any particular MR scanning device.

Computer system 1100 may be used to implement one or more techniques described herein. Computer system 1100 may include one or more processors 1110 and one or more non-transitory computer-readable storage media (e.g., memory 1120 and one or more non-volatile storage media 1130). The processor 1110 may control writing data to and reading data from the memory 1120 and the non-volatile storage device 1130 in any suitable manner. Processor 1110, for example, may be a processor on any device, for example, a personal computer, a workstation, one or more servers, or may be a processor on-board or otherwise integrated with MR scanning device 1150, etc.

To perform functionality and/or techniques described herein, the processor(s) 1110 may execute one or more instructions stored in one or more computer-readable storage media (e.g., the memory 1120, storage media, etc.), which may serve as non-transitory computer-readable storage media storing instructions for execution by processor(s) 1110. Computer system 1100 may also include any other processor, controller, or control unit needed to route data, perform computations, perform I/O functionality, etc. For example, computer system 1100 may include any number and type of input functionality to receive data and/or may include any number and type of output functionality to provide data, and may include control apparatus to perform I/O functionality.

Computer system 1100 may be integrated into MR scanning device 1150 or may be a separate stand-alone computer system, either proximate to or remote from MR scanning device 1150. For example, computer system 1100 may be connected to MR scanning device 1150 over a network, connected to multiple scanning devices or may not be connected to any scanning device at all. When computer system 1100 is connected to or integrated with MR scanning device 1150, computer system 1100 may be programmed to control the RF coil(s) according to a desired RF sequence or protocol, or MR scanning device 1150 may have a separate controller to perform excitation and acquisition.

When computer system 1100 is separate from MR scanning device 1150, computer system 1100 may operate on MR data previously stored on computer system 1100, may obtain MRI data from some other location, e.g., another computer system, over a network, or may obtain the MRI data via transportable storage medium, etc. It should be appreciated that any computing environment may be used, as the techniques described herein are not limited for use with a computer system of any particular type or implementation.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Through, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, embodiments may be embodied as a non-transitory computer readable medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other non-transitory, tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above. As used herein, the term "non-transitory computer-readable storage medium" encompasses only a computer-readable medium that can be considered to be a manufacture (i.e., article of manufacture) or a machine.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect of this embodiment, one or more computer programs that when executed perform methods of embodiments need not reside on a single computer or processor, but may be distributed in a modular fashion amongst a number of different computers or processors to implement various embodiments.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationships between data elements.

Various aspects of embodiments may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, embodiments may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting.

The invention claimed is:

1. A computer system configured to process magnetic resonance imaging (MRI) data to perform bone segmentation, the computer system comprising:
    an input interface configured to receive the MRI data, wherein the MRI data comprises a set of gradient-echo images acquired throughout a spin echo;
    at least one processor programmed to generate based, at least in part, on at least two images in the set of gradient-echo images, a bone segmentation image, wherein the at least two images include a first image corresponding to a beginning portion of the spin echo and a second image corresponding to a central portion of the spin echo; and
    an output interface configured to output the bone segmentation image.

2. The computer system of claim 1, wherein generating the bone segmentation image comprises:
    subtracting the first image from the second image to generate a subtracted image; and
    thresholding the subtracted image to generate the bone segmentation image.

3. The computer system of claim 1, wherein generating the bone segmentation image comprises:
    generating based, at least in part, on the set of gradient-echo images, a parametric map of reversible relaxation rate; and
    generating the bone segmentation image based, at least in part, on the parametric map.

4. The computer system of claim 1, wherein the images in the set of gradient-echo images have a temporal spacing such that fat and water are in-phase in at least one first image in the set and out-of phase in at least one second image in the set.

5. The computer system of claim 1, wherein the images in the set of gradient-echo images were acquired using a gradient-echo sampling of the spin echo (GESSE) pulse sequence or a gradient-echo sampling of free induction decay and echo (GESFIDE) pulse sequence.

6. The computer system of claim 1, wherein the at least one processor is further programmed to:
    generate the bone segmentation image for each of a plurality of slices through an imaged anatomical part comprising bone; and
    generate based, at least in part, on the generated bone segmentation images, a three-dimensional representation of the bone in the imaged anatomical part.

7. The computer system of claim 6, further comprising a three-dimensional printer, wherein the three-dimensional printer is configured to create a physical model of the bone in the imaged anatomical part based, at least in part, on the generated three-dimensional representation.

8. A method of performing bone segmentation by processing magnetic resonance imaging (MRI) data, the method comprising:
    receiving the MRI data, wherein the MRI data comprises a set of gradient-echo images acquired by an MRI system throughout a spin echo;
    generating, by at least one computer, a bone segmentation image, wherein the generating is based, at least in part, on at least two images in the set of gradient-echo images, wherein the at least two images include a first image corresponding to a beginning portion of the spin echo and a second image corresponding to a central portion of the spin echo; and
    outputting the bone segmentation image.

9. The method of claim 8, wherein generating the bone segmentation image comprises:
    subtracting the first image from the second image to generate a subtracted image; and
    thresholding the subtracted image to generate the bone segmentation image.

10. The method of claim 8, wherein generating the bone segmentation image comprises:
    generating based, at least in part, on the set of gradient-echo images, a parametric map of reversible relaxation rate; and
    generating the bone segmentation image based, at least in part, on the parametric map.

11. The method of claim 8, wherein the images in the set of gradient-echo images have a temporal spacing such that fat and water are in-phase in at least one first image in the set and out-of phase in at least one second image in the set.

12. The method of claim 8, wherein the images in the set of gradient-echo images were acquired using a gradient-echo sampling of the spin echo (GESSE) pulse sequence or a gradient-echo sampling of free induction decay and echo (GESFIDE) pulse sequence.

13. The method of claim 8, further comprising:
generating the bone segmentation image for each of a plurality of slices through an imaged anatomical part comprising bone; and
generating based, at least in part, on the generated bone segmentation images, a three-dimensional representation of the bone in the imaged anatomical part.

14. The method of claim 13, further comprising:
creating a physical model of the bone in the imaged anatomical part based, at least in part, on the generated three-dimensional representation.

15. A non-transitory computer readable medium encoded with a plurality of instructions that, when executed by at least one computer, perform a method of performing bone segmentation by processing magnetic resonance imaging (MRI) data, the method comprising:
receiving the MRI data, wherein the MRI data comprises a set of gradient-echo images acquired by an MRI system throughout a spin echo;
generating based, at least in part, on at least two images in the set of gradient-echo images, a bone segmentation image, wherein the at least two images include a first image corresponding to a beginning portion of the spin echo and a second image corresponding to a central portion of the spin echo; and
outputting the bone segmentation image.

16. The non-transitory computer readable medium of claim 15, wherein generating the bone segmentation image comprises:
subtracting the first image from the second image to generate a subtracted image; and
thresholding the subtracted image to generate the bone segmentation image.

17. The non-transitory computer readable medium of claim 15, wherein generating the bone segmentation image comprises:
generating based, at least in part, on the set of gradient-echo images, a parametric map of reversible relaxation rate; and
generating the bone segmentation image based, at least in part, on the parametric map.

18. The non-transitory computer readable medium of claim 15, wherein the images in the set of gradient-echo images have a temporal spacing such that fat and water are in-phase in at least one first image in the set and out-of phase in at least one second image in the set.

19. The non-transitory computer readable medium of claim 15, wherein the images in the set of gradient-echo images were acquired using a gradient-echo sampling of the spin echo (GESSE) pulse sequence or a gradient-echo sampling of free induction decay and echo (GESFIDE) pulse sequence.

20. The non-transitory computer readable medium of claim 15, wherein the method further comprises:
generating the bone segmentation image for each of a plurality of slices through an imaged anatomical part comprising bone; and
generating based, at least in part, on the generated bone segmentation images, a three-dimensional representation of the bone in the imaged anatomical part.

* * * * *